US 6,609,553 B2

(12) United States Patent
Yanagita et al.

(10) Patent No.: US 6,609,553 B2
(45) Date of Patent: Aug. 26, 2003

(54) SAMPLE PROCESSING APPARATUS AND METHOD

(75) Inventors: Kazutaka Yanagita, Yokohama (JP); Takao Yonehara, Atsugi (JP); Kazuaki Omi, Yokohama (JP); Kiyofumi Sakaguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/175,004

(22) Filed: Jun. 20, 2002

(65) Prior Publication Data
US 2002/0157794 A1 Oct. 31, 2002

Related U.S. Application Data

(62) Division of application No. 09/359,575, filed on Jul. 22, 1999, now Pat. No. 6,427,748.

(30) Foreign Application Priority Data

Jul. 27, 1998 (JP) .......................... 10-211509
Jul. 27, 1998 (JP) .......................... 10-211510
Aug. 26, 1998 (JP) .......................... 10-240665

(51) Int. Cl.$^7$ .............................................. B32B 35/00
(52) U.S. Cl. ...................... 156/584; 156/344; 29/426.4; 438/458; 83/177
(58) Field of Search ................................ 156/239, 344, 156/529, 584; 83/177; 29/426.4, 426.5, 762; 438/455, 458

(56) References Cited

U.S. PATENT DOCUMENTS

| 3,708,263 A | * | 1/1973 | Boucher ....................... 422/20 |
| 4,867,836 A | | 9/1989 | Hamamura et al. ......... 156/584 |
| 4,880,488 A | | 11/1989 | Matsuo et al. ............... 156/344 |
| 4,962,879 A | * | 10/1990 | Goesele et al. .............. 156/281 |
| 5,141,584 A | | 8/1992 | Schuh et al. ................. 156/344 |
| 5,447,596 A | | 9/1995 | Hayase ....................... 156/584 |
| 5,501,240 A | * | 3/1996 | Dohku et al. ............. 134/102.2 |
| 5,656,127 A | | 8/1997 | De Niel et al. ............. 156/584 |
| 5,783,022 A | | 7/1998 | Cha et al. .................... 156/344 |
| 5,994,207 A | | 11/1999 | Henley et al. ............... 438/515 |
| 6,221,740 B1 | | 4/2001 | Bryan et al. ................. 438/458 |

FOREIGN PATENT DOCUMENTS

| EP | 0 797 258 A2 | 9/1997 |
| EP | 0 849 788 A2 | 6/1998 |
| EP | 0 797 258 A3 | 4/1999 |
| JP | 5-6883 | 1/1993 |
| JP | 5-21338 | 1/1993 |
| JP | 7-302889 | 11/1995 |
| JP | 9-167724 | 6/1997 |
| KR | 96-21353 | 7/1996 |
| KR | 97-67955 | 10/1997 |

OTHER PUBLICATIONS

"History of Water Jet Machining Development"; *1984 Journal of the Water Jet Technology Society of Japan*, 1–1 (concise explanation provided in specification).

* cited by examiner

Primary Examiner—Mark A. Osele
(74) Attorney, Agent, or Firm—Morgan & Finnegan, LLP

(57) ABSTRACT

This invention prevents defects generated when a bonded substrate stack having a separation layer is separated. A bonded substrate stack (101) having a porous layer (101*b*) is separated in two steps of the first and second processes. In the first process, a jet is ejected to the porous layer (101*b*) while rotating the bonded substrate stack (101) to partially separate the bonded substrate stack (101) while leaving the central portion of the porous layer (101*b*) as an unseparated region. In the second process, the jet is ejected to the porous layer (101*b*) while rotation of the bonded substrate stack (101) is stopped. A force is applied to the unseparated region from a predetermined direction to completely separate the bonded substrate stack (101). Also, the first region (peripheral portion) and second region (central portion) of the bonded substrate stack (101) having the porous layer (101*b*) are separated using a jet and ultrasonic wave, respectively. More specifically, the first region is separated by a jet ejected from a nozzle (102) while rotating the bonded substrate stack (101). On the other hand, the second region is separated by an ultrasonic wave generated by an ultrasonic vibrator (1203).

42 Claims, 31 Drawing Sheets

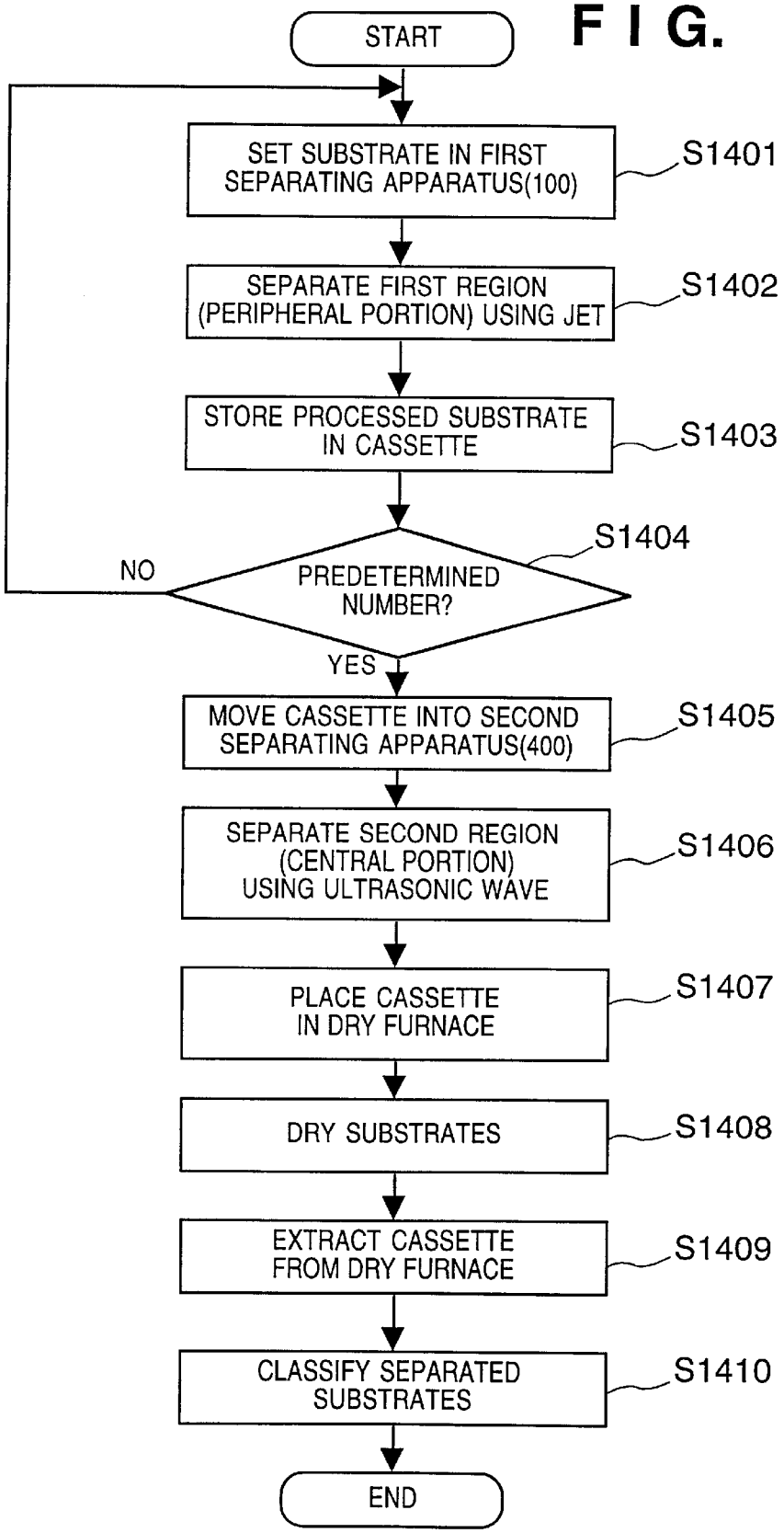

SAMPLE PROCESSING APPARATUS AND METHOD

CROSS-REFERENCE TO RELATED APPLICATION

This is a divisional application under 37 C.F.R. §1.53(b) of copending U.S. patent application Ser. No. 09/359,575, filed on Jul. 22, 1999 now U.S. Pat. No. 6,427,748 which is incorporated herein by reference in its entirety.

BACKGROUND OF THE INVENTION

1. Field of the Invention

The present invention relates to a sample processing apparatus and method and, more particularly, to a processing apparatus and method suitable for processing a sample having a separation layer.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A completely depleted field-effect transistor can be formed by thin film formation.

Since an SOI structure has the above various advantages, researches have been made on its formation method for several decades.

As one SOI technology, the SOS (Silicon On Sapphire) technology by which Si is heteroepitaxially grown on a single-crystal sapphire substrate by CVD (Chemical Vapor Deposition) has been known for a long time. This SOS technology once earned a reputation as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

The SIMOX (Separation by Ion iMplanted OXygen) technology has appeared next to the SOS technology. For this SIMOX technology, various methods have been examined to reduce crystal defects or manufacturing cost. The methods include a method of ion-implanting oxygen into a substrate to form a buried oxide layer, a method of bonding two wafers via an oxide film and polishing or etching one wafer to leave a thin single-crystal Si layer on the oxide film, and a method of ion-implanting hydrogen to a predetermined depth from the surface of an Si substrate having an oxide film, bonding the substrate to another substrate, leaving a thin single-crystal Si layer on the oxide film by heating or the like, and peeling one (the other substrate) of the bonded substrates.

The present applicant has disclosed a new SOI technology in Japanese Patent Laid-Open No. 5-21338. In this technology, a first substrate prepared by forming a non-porous single-crystal layer (including a single-crystal Si layer) on a single-crystal semiconductor substrate having a porous layer is bonded to a second substrate via an insulating layer. After this, the substrates are separated at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred angstrom to 10-$\mu$m thick SOI films can be manufactured by a single manufacturing apparatus.

The present applicant has also disclosed, in Japanese Patent Laid-Open No. 7-302889, a technique of bonding first and second substrates, separating the first substrate from the second substrate without destroying the first substrate, smoothing the surface of the separated first substrate, forming a porous layer again, and reusing the porous layer. Since the first substrate is not wasted, this technique is advantageous in greatly reducing the manufacturing cost and simplifying the manufacturing process.

In the above techniques, when a substrate (to be referred to as a bonded substrate stack hereinafter) obtained by bonding two substrates is separated at the porous layer, they must be separated with high reproducibility and without inflicting any damage on them.

SUMMARY OF THE INVENTION

The present invention has been made in consideration of the above situation, and has as its object to provide an apparatus and method suitable for preventing any damage in separating a sample such as a substrate having a separation layer.

When a sample such as a substrate having a separation layer is to be separated, a partial region is left as an unseparated region in the first process, and then, a force is applied to the unseparated region from a predetermined direction to completely separate the sample in the second process, thereby preventing defects in separating the sample.

An apparatus and method according to the first and second aspects of the present invention are suitable for the first process. Separation conditions in the second process are uniformed by the apparatus and method according to the first and second aspects to facilitate control of the second process, thereby preventing defects in separating the sample.

According to the first aspect of the present invention, there is provided a processing apparatus for processing a sample having a separation layer, characterized by comprising a separation mechanism for partially separating the sample at the separation layer while leaving a predetermined region of the separation layer as an unseparated region.

In the processing apparatus according to the first aspect, preferably, for example, the separation mechanism has an ejection portion for ejecting a fluid to the separation layer and partially separates the sample using the fluid.

In the processing apparatus according to the first aspect, for example, the sample preferably comprises a plate member having a layer with a fragile structure as the separation layer.

In the processing apparatus according to the first aspect, for example, the separation mechanism preferably partially separates the sample while leaving a substantially circular region as the unseparated region.

In the processing apparatus according to the first aspect, for example, the separation mechanism preferably partially separates the sample while leaving a substantially circular region at a substantially central portion of the separation layer as the unseparated region.

In the processing apparatus according to the first aspect, preferably, for example, the separation mechanism comprises a driving mechanism for rotating the sample about an axis perpendicular to the separation layer, and the ejection portion for ejecting a fluid to the separation layer, and the sample is partially separated while rotating the sample by the driving mechanism.

In the processing apparatus according to the first aspect, preferably, for example, the driving mechanism rotates the sample at a low speed at an initial stage of partial separation processing of the sample and then rotates the sample at a high speed.

In the processing apparatus according to the first aspect, for example, the driving mechanism preferably increases a rotational speed of the sample gradually or stepwise in partially separating the sample.

In the processing apparatus according to the first aspect, for example, the driving mechanism preferably changes a rotational speed of the sample in partially separating the sample.

In the processing apparatus according to the first aspect, preferably, for example, the ejection portion ejects a fluid with a high pressure at an initial stage of partial separation processing of the sample and then reduces the pressure of the fluid.

In the processing apparatus according to the first aspect, for example, the ejection portion preferably reduces a pressure of the fluid to be ejected gradually or stepwise in partially separating the sample.

In the processing apparatus according to the first aspect, for example, the ejection portion preferably changes a pressure of the fluid to be ejected in partially separating the sample.

In the processing apparatus according to the first aspect, for example, the ejection portion preferably ejects the fluid to a position apart from a center of the separation layer by a predetermined distance in a planar direction in partially separating the sample.

In the processing apparatus according to the first aspect, for example, the unseparated region is preferably smaller than a region where the separation layer is separated by partial separation processing.

In the processing apparatus according to the first aspect, for example, the sample is preferably formed by bonding a first plate member having a fragile layer to a second plate member.

In the processing apparatus according to the first aspect, for example, the fragile layer preferably comprises a porous layer.

In the processing apparatus according to the first aspect, for example, the first plate member preferably comprises a semiconductor substrate.

In the processing apparatus according to the first aspect, for example, the first plate member is preferably formed by forming the porous layer on one surface of a semiconductor substrate and forming a non-porous layer on the porous layer.

In the processing apparatus according to the first aspect, for example, the non-porous layer preferably includes a single-crystal semiconductor layer.

According to the second aspect of the present invention, there is provided a processing method of processing a sample having a separation layer, characterized by comprising the separation step of partially separating the sample at the separation layer while leaving a predetermined region of the separation layer as an unseparated region.

In the processing method according to the second aspect, for example, the sample is preferably partially separated by ejecting a fluid to the separation layer.

In the processing method according to the second aspect, for example, the sample preferably comprises a plate member having a layer with a fragile structure as the separation layer.

In the processing method according to the second aspect, for example, the sample is preferably partially separated while leaving a substantially circular region as the unseparated region.

In the processing method according to the second aspect, for example, the sample is preferably partially separated while leaving a substantially circular region at a substantially central portion of the separation layer as the unseparated region.

In the processing method according to the second aspect, for example, the sample is preferably partially separated by ejecting the fluid to the separation layer while rotating the sample about an axis perpendicular to the separation layer.

In the processing method according to the second aspect, for example, the sample is preferably rotated at a low speed at an initial stage of the separation step and then at a high speed.

In the processing method according to the second aspect, for example, a rotational speed of the sample is preferably increased gradually or stepwise in partially separating the sample.

In the processing method according to the second aspect, for example, a rotational speed of the sample is preferably changed in partially separating the sample.

In the processing method according to the second aspect, preferably, for example, a fluid with a high pressure is used at an initial stage of partial separation of the sample and then the fluid with a low pressure is used.

In the processing method according to the second aspect, for example, a pressure of the fluid to be used for separation is preferably reduced gradually or stepwise in partially separating the sample.

In the processing method according to the second aspect, for example, a pressure of the fluid to be used for separation is preferably changed in partially separating the sample.

In the processing method according to the second aspect, for example, the fluid is preferably ejected to a position apart from a center of the separation layer by a predetermined distance in a planar direction in partially separating the sample.

In the processing method according to the second aspect, for example, the unseparated region is preferably smaller than a region where the separation layer is separated in separation processing.

In the processing method according to the second aspect, for example, the sample is preferably formed by bonding a first plate member having a fragile layer to a second plate member.

In the processing method according to the second aspect, for example, the fragile layer preferably comprises a porous layer.

In the processing method according to the second aspect, for example, the first plate member preferably comprises a semiconductor substrate.

In the processing method according to the second aspect, for example, the first plate member is formed by forming the porous layer on one surface of a semiconductor substrate and forming a non-porous layer on the porous layer.

In the processing method according to the second aspect, for example, the non-porous layer includes a single-crystal semiconductor layer.

According to the third aspect of the present invention, there is provided a separating apparatus for separating a sample having a separation layer at the separation layer, characterized by comprising first separation means for partially separating the sample at the separation layer while leaving a predetermined region of the separation layer as an unseparated region, and second separation means for applying a force to the unseparated region of the sample processed by the first separation means from a predetermined direction to completely separate the sample.

In the separating apparatus according to the third aspect, for example, the sample preferably comprises a plate member having a layer with a fragile structure as the separation layer.

In the separating apparatus according to the third aspect, for example, the first separation means preferably partially separates the sample while leaving a substantially circular region as the unseparated region.

In the separating apparatus according to the third aspect, for example, the first separation means preferably partially separates the sample while leaving a substantially circular region at a substantially central portion of the separation layer as the unseparated region.

In the separating apparatus according to the third aspect, preferably, for example, the first separation means ejects the fluid to the separation layer while rotating the sample about an axis perpendicular to the separation layer so as to partially separate the sample, and the second separation means holds the sample without rotating the sample and ejects the fluid to a gap in the sample, which is formed by partial separation processing, to separate the unseparated region remaining in the sample.

In the separating apparatus according to the third aspect, preferably, for example, the first separation means ejects the fluid to the separation layer of the sample while rotating the sample about an axis perpendicular to the separation layer so as to partially separate the sample, and the second separation means ejects the fluid to a gap in the sample, which is formed by partial separation processing, while substantially stopping rotating the sample so as to separate the unseparated region remaining in the sample.

In the separating apparatus according to the third aspect, for example, the second separation means preferably inserts a wedge into a gap in the sample, which is formed by partial separation processing, to completely separate the sample.

In the separating apparatus according to the third aspect, for example, the unseparated region left after processing by the first separation means is preferably smaller than a region separated by the first separation means.

In the separating apparatus according to the third aspect, for example, the sample is preferably formed by bonding a first plate member having a fragile layer to a second plate member.

In the separating apparatus according to the third aspect, for example, the fragile layer preferably comprises a porous layer.

In the separating apparatus according to the third aspect, for example, the first plate member preferably comprises a semiconductor substrate.

In the separating apparatus according to the third aspect, for example, the first plate member is preferably formed by forming the porous layer on one surface of a semiconductor substrate and forming a non-porous layer on the porous layer.

In the separating apparatus according to the third aspect, for example, the non-porous layer preferably includes a single-crystal semiconductor layer.

According to the fourth aspect of the present invention, there is provided a separating apparatus for separating a sample having a separation layer at the separation layer, characterized by comprising a driving mechanism for rotating the sample about an axis perpendicular to the separation layer of the sample, and an ejection portion for ejecting a fluid to the separation layer, wherein the sample is partially separated at the separation layer using the fluid from the ejection portion while rotating the sample by the driving mechanism and leaving a predetermined region of the separation layer as an unseparated region, and the sample is completely separated by separating the unseparated region using the fluid from the ejection portion while substantially stopping rotating the sample.

In the separating apparatus according to the fourth aspect, for example, the sample preferably comprises a plate member having a layer with a fragile structure as the separation layer.

In the separating apparatus according to the fourth aspect, for example, in partially separating the sample, a substantially circular region is preferably left as the unseparated region.

In the separating apparatus according to the fourth aspect, for example, in partially separating the sample, a substantially circular region is preferably left at a substantially central portion of the separation layer as the unseparated region.

In the separating apparatus according to the fourth aspect, for example, the unseparated region left after partial separation processing is preferably smaller than a region separated by partial separation processing.

In the separating apparatus according to the fourth aspect, for example, the sample is preferably formed by bonding a first plate member having a fragile layer to a second plate member.

In the separating apparatus according to the fourth aspect, for example, the fragile layer preferably comprises a porous layer.

In the separating apparatus according to the fourth aspect, for example, the first plate member preferably comprises a semiconductor substrate.

In the separating apparatus according to the fourth aspect, for example, the first plate member is preferably formed by forming the porous layer on one surface of a semiconductor substrate and forming a non-porous layer on the porous layer.

In the separating apparatus according to the fourth aspect, for example, the non-porous layer preferably includes a single-crystal semiconductor layer.

According to the fifth aspect of the present invention, there is provided a separating apparatus for separating a sample having a separation layer at the separation layer, characterized by comprising a first separation mechanism for partially separating the sample at the separation layer while leaving a predetermined region of the separation layer as an unseparated region, and a second separation mechanism for applying a force to a gap formed in the sample by separation processing by the first separation mechanism from a predetermined direction to completely separate the sample.

In the separating apparatus according to the fifth aspect, for example, the first separation mechanism preferably ejects a fluid to the separation layer while rotating the sample about an axis perpendicular to the separation layer so as to partially separate the sample.

In the separating apparatus according to the fifth aspect, for example, the second separation mechanism preferably inserts a wedge into a gap in the sample to completely separate the sample.

The separating apparatus according to the fifth aspect preferably further comprises, e.g., a conveyor robot for conveying the sample processed by the first separation mechanism to the second separation mechanism.

The separating apparatus according to the fifth aspect preferably further comprises, e.g., a positioning mechanism for positioning the sample with respect to the first separation mechanism or the second separation mechanism.

In the separating apparatus according to the fifth aspect, for example, the unseparated region left after processing by the first separation mechanism is preferably smaller than a region separated by the first separation mechanism.

In the separating apparatus according to the fifth aspect, for example, the sample is preferably formed by bonding a first plate member having a fragile layer to a second plate member.

In the separating apparatus according to the fifth aspect, for example, the fragile layer preferably comprises a porous layer.

In the separating apparatus according to the fifth aspect, for example, the first plate member preferably comprises a semiconductor substrate.

In the separating apparatus according to the fifth aspect, for example, the first plate member is preferably formed by forming the porous layer on one surface of a semiconductor substrate and forming a non-porous layer on the porous layer.

In the separating apparatus according to the fifth aspect, for example, the non-porous layer preferably includes a single-crystal semiconductor layer.

According to the sixth aspect of the present invention, there is provided a separating apparatus for separating a sample having a separation layer at the separation layer, characterized by comprising a holding mechanism for partially holding the sample partially separated at the separation layer while leaving a predetermined region of the separation layer as an unseparated region, thereby setting the sample substantially at rest, and a separation mechanism for applying a force to the unseparated region of the sample held by the holding mechanism from a predetermined direction to completely separate the sample.

In the separating apparatus according to the sixth aspect, for example, the sample preferably comprises a plate member having a layer with a fragile structure as the separation layer.

In the separating apparatus according to the sixth aspect, for example, the separation mechanism preferably ejects a fluid to a gap in the sample, which is formed by partial separation processing, to completely separate the sample.

In the separating apparatus according to the sixth aspect, for example, the separation mechanism preferably inserts a wedge into a gap in the sample, which is formed by partial separation processing, to completely separate the sample.

In the separating apparatus according to the sixth aspect, for example, the unseparated region is preferably smaller than a region which is already separated.

In the separating apparatus according to the sixth aspect, for example, the sample is preferably formed by bonding a first plate member having a fragile layer to a second plate member.

In the separating apparatus according to the sixth aspect, for example, the fragile layer preferably comprises a porous layer.

In the separating apparatus according to the sixth aspect, for example, the first plate member preferably comprises a semiconductor substrate.

In the separating apparatus according to the sixth aspect, for example, the first plate member is formed by forming the porous layer on one surface of a semiconductor substrate and forming a non-porous layer on the porous layer.

In the separating apparatus according to the sixth aspect, for example, the non-porous layer preferably includes a single-crystal semiconductor layer.

According to the seventh aspect of the present invention, there is provided a separating method of separating a sample having a separation layer at the separation layer, characterized by comprising the first separation step of partially separating the sample at the separation layer while leaving a predetermined region of the separation layer as an unseparated region, and the second separation step of applying a force to the unseparated region of the sample processed in the first separation step from a predetermined direction to completely separate the sample.

In the separating method of the seventh aspect, for example, the sample preferably comprises a plate member having a layer with a fragile structure as the separation layer.

In the separating method of the seventh aspect, for example, the first separation step preferably comprises partially separating the sample while leaving a substantially circular region as the unseparated region.

In the separating method of the seventh aspect, for example, the first separation step preferably comprises partially separating the sample while leaving a substantially circular region at a substantially central portion of the separation layer as the unseparated region.

In the separating method of the seventh aspect, preferably, for example, the first separation step comprises ejecting a fluid to the separation layer while rotating the sample about an axis perpendicular to the separation layer so as to partially separate the sample, and the second separation step comprises holding the sample without rotating the sample and ejecting the fluid to a gap in the sample, which is formed by partial separation processing, to separate the unseparated region remaining in the sample.

In the separating method of the seventh aspect, preferably, for example, the first separation step comprises ejecting a fluid to the separation layer of the sample while rotating the sample about an axis perpendicular to the separation layer so as to partially separate the sample, and the second separation step comprises ejecting the fluid to a gap in the sample, which is formed by partial separation processing, while substantially stopping rotating the sample so as to separate the unseparated region remaining in the sample.

In the separating method of the seventh aspect, for example, the second separation step preferably comprises inserting a wedge into a gap in the sample, which is formed by partial separation processing, to completely separate the sample.

In the separating method of the seventh aspect, for example, the unseparated region left after the first separation step is preferably smaller than a region separated in the first separation step.

In the separating method of the seventh aspect, for example, the sample is preferably formed by bonding a first plate member having a fragile layer to a second plate member.

In the separating method of the seventh aspect, for example, the fragile layer preferably comprises a porous layer.

In the separating method of the seventh aspect, for example, the first plate member preferably comprises a semiconductor substrate.

In the separating method of the seventh aspect, for example, the first plate member is preferably formed by forming the porous layer on one surface of a semiconductor substrate and forming a non-porous layer on the porous layer.

In the separating method of the seventh aspect, for example, the non-porous layer preferably includes a single-crystal semiconductor layer.

According to the eighth aspect of the present invention, there is provided a separating method of separating a sample having a separation layer at the separation layer, characterized by comprising the stopping step of partially holding the sample partially separated at the separation layer while leaving a predetermined region of the separation layer as an unseparated region, thereby setting the sample substantially at rest, and the separation step of applying a force to the unseparated region of the sample at rest from a predetermined direction to completely separate the sample.

In the separating method of the eighth aspect, for example, the sample preferably comprises a plate member having a layer with a fragile structure as the separation layer.

In the separating method of the eighth aspect, for example, the separation step preferably comprises ejecting a fluid to a gap in the sample, which is formed by partial separation processing, to completely separate the sample.

In the separating method of the eighth aspect, for example, the separation step preferably comprises inserting a wedge into a gap in the sample, which is formed by partial separation processing, to completely separate the sample.

In the separating method of the eighth aspect, for example, the unseparated region is preferably smaller than a region which is already separated.

In the separating method of the eighth aspect, for example, the sample is preferably formed by bonding a first plate member having a fragile layer to a second plate member.

In the separating method of the eighth aspect, for example, the fragile layer comprises a porous layer.

In the separating method of the eighth aspect, for example, the first plate member preferably comprises a semiconductor substrate.

In the separating method of the eighth aspect, for example, the first plate member is preferably formed by forming the porous layer on one surface of a semiconductor substrate and forming a non-porous layer on the porous layer.

In the separating method of the eighth aspect, for example, the non-porous layer preferably includes a single-crystal semiconductor layer.

According to the ninth aspect of the present invention, there is provided a separating apparatus for separating a sample having a separation layer at the separation layer, characterized by comprising first separation means for ejecting a fluid to the separation layer to mainly separate a first region of the separation layer, and second separation means for mainly separating a second region of the separation layer using a vibration energy, wherein the sample is separated at the separation layer by the first and second separation means.

In the separating apparatus according to the ninth aspect, for example, the sample preferably comprises a plate member having a layer with a fragile structure as the separation layer.

In the separating apparatus according to the ninth aspect, preferably, for example, the first region is a region at a periphery of the separation layer, and the second region is a region at a center of the separation layer.

In the separating apparatus according to the ninth aspect, for example, the first separation means preferably ejects the fluid to the separation layer while rotating the sample about an axis perpendicular to the separation layer so as to mainly separate the first region.

Preferably, for example, the separating apparatus according to the ninth aspect further comprises support means for supporting the sample in separation processing by the first and second separation means, and the second separation means supplies the vibration energy from a portion where the support means is in contact with the sample to the sample.

In the separating apparatus according to the ninth aspect, preferably, for example, the support means has a pair of opposing support surfaces for sandwiching a portion near a central portion of the sample from both sides and pressing the portion to support the sample, and the support surface has a substantially circular shape.

In the separating apparatus according to the ninth aspect, preferably, for example, the first region is substantially positioned outside a region pressed by the support surfaces, and the second region is substantially the region pressed by the support surfaces.

In the separating apparatus according to the ninth aspect, preferably, for example, the second separation means comprises a process tank for processing the sample, and a vibration source for generating the vibration energy, and the vibration energy generated by the vibration source is supplied to the sample via a liquid in the process tank while immersing the sample processed by the first separation means in the process tank.

In the separating apparatus according to the ninth aspect, for example, the process tank preferably comprises partition means for partitioning separated samples when the sample is completely separated by the vibration energy.

In the separating apparatus according to the ninth aspect, preferably, for example, the first separation means mainly separates the first region first, and then, the second separation means mainly separates the second region.

In the separating apparatus according to the ninth aspect, preferably, for example, the second separation means mainly separates the second region first, and then, the first separation means mainly separates the first region.

In the separating apparatus according to the ninth aspect, for example, separation processing by the first separation means and at least part of separation processing by the second separation means are preferably parallelly executed.

In the separating apparatus according to the ninth aspect, for example, the sample is preferably formed by bonding a first plate member having a fragile layer to a second plate member.

In the separating apparatus according to the ninth aspect, for example, the fragile layer preferably comprises a porous layer.

In the separating apparatus according to the ninth aspect, for example, the first plate member preferably comprises a semiconductor substrate.

In the separating apparatus according to the ninth aspect, for example, the first plate member is preferably formed by forming the porous layer on one surface of a semiconductor substrate and forming a non-porous layer on the porous layer.

In the separating apparatus according to the ninth aspect, for example, the non-porous layer preferably includes a single-crystal semiconductor layer.

According to the ninth aspect of the present invention, there is also provided a separating apparatus for separating a sample having a separation layer at the separation layer, characterized by comprising a support portion for supporting the sample, an ejection portion for ejecting a fluid to the separation layer of the sample supported by the support portion, and a vibration source for generating a vibration energy to be supplied to the sample, wherein the sample is separated by the fluid and vibration energy.

In the separating apparatus according to the ninth aspect, for example, the sample preferably comprises a plate member having a layer with a fragile structure as the separation layer.

In the separating apparatus according to the ninth aspect, for example, the support portion preferably supports the sample while rotating the sample about an axis perpendicular to the separation layer.

The separating apparatus according to the ninth aspect preferably further comprises, e.g., a control section for causing the ejection portion to eject the fluid to mainly separate a first region of the separation layer by the fluid and causing the vibration source to generate the vibration energy to mainly separate a second region of the separation layer by the vibration energy.

In the separating apparatus according to the ninth aspect, for example, the control section preferably controls the ejection portion and the vibration source to mainly separate the first region first by the fluid and then mainly separate the second region by the vibration energy.

In the separating apparatus according to the ninth aspect, for example, the control section preferably controls the ejection portion and the vibration source to mainly separate the second region first by the vibration energy and then mainly separate the first region by the fluid.

In the separating apparatus according to the ninth aspect, for example, the control section preferably controls the ejection portion and the vibration source to parallelly execute separation processing of the sample by the fluid and at least part of separation processing of the sample by the vibration energy.

In the separating apparatus according to the ninth aspect, preferably, for example, the first region is a region at a periphery of the separation layer, and the second region is a region at a center of the separation layer.

In the separating apparatus according to the ninth aspect, preferably, for example, the support portion has a pair of opposing support surfaces for sandwiching a portion near a central portion of the sample from both sides and pressing the portion to support the sample, and the support surface has a substantially circular shape.

In the separating apparatus according to the ninth aspect, preferably, for example, the first region is positioned substantially on an outer peripheral side of a region pressed by the support surfaces, and the second region is substantially the region pressed by the support surfaces.

In the separating apparatus according to the ninth aspect, for example, the vibration source is preferably arranged at the support portion.

In the separating apparatus according to the ninth aspect, for example, the vibration source is preferably arranged at a distal end of the support portion, where the support portion comes into contact with the sample.

In the separating apparatus according to the ninth aspect, preferably, for example, the apparatus further comprises a process tank for processing the sample, to separate the sample using the fluid, the fluid is ejected to the separation layer of the sample while supporting the sample by the support portion, and to separate the sample using the vibration energy, the vibration energy generated by the vibration source is supplied to the sample via a liquid in the process tank while immersing the sample in the process tank.

In the separating apparatus according to the ninth aspect, for example, the process tank preferably has a partition member for partitioning separated samples when the sample is completely separated by the vibration energy.

The separating apparatus according to the ninth aspect preferably further comprises, e.g., a dry furnace for drying the sample processed in the process tank.

The separating apparatus according to the ninth aspect preferably further comprises, e.g., a classification mechanism for classifying separated samples.

The separating apparatus according to the ninth aspect preferably further comprises e.g., a conveyor mechanism for receiving the sample from the support portion and conveying the sample to the process tank.

The separating apparatus according to the ninth aspect preferably further comprises, e.g., a conveyor mechanism for sequentially receiving a plurality of samples from the support portion, sequentially storing the plurality of samples in one cassette, and setting the cassette in the process tank.

The separating apparatus according to the ninth aspect preferably further comprises, e.g., a conveyor mechanism for conveying the sample between the support portion, the process tank and the dry furnace.

The separating apparatus according to the ninth aspect preferably further comprises, e.g., a conveyor mechanism for sequentially receiving a plurality of samples from the support portion, sequentially storing the plurality of samples in one cassette, immersing the cassette in the process tank, and after processing in the process tank is ended, receiving the cassette from the process tank and conveying the cassette to the dry furnace.

The separating apparatus according to the ninth aspect preferably further comprises, e.g., a classification mechanism for, after separated samples are dried in the dry furnace, extracting the separated samples from the dry furnace and classifying the samples.

In the separating apparatus according to the ninth aspect, for example, the sample is preferably formed by bonding a first plate member having a fragile layer to a second plate member.

In the separating apparatus according to the ninth aspect, for example, the fragile layer preferably comprises a porous layer.

In the separating apparatus according to the ninth aspect, for example, the first plate member preferably comprises a semiconductor substrate.

In the separating apparatus according to the ninth aspect, for example, the first plate member is preferably formed by forming the porous layer on one surface of a semiconductor substrate and forming a non-porous layer on the porous layer.

In the separating apparatus according to the ninth aspect, for example, the non-porous layer preferably includes a single-crystal semiconductor layer.

According to the 10th aspect of the present invention, there is provided a separating method of separating a sample having a separation layer at the separation layer, characterized by comprising the first separation step of ejecting a fluid to the separation layer to mainly separate a first region of the separation layer, and the second separation step of mainly separating a second region of the separation layer using a vibration energy, wherein the sample is separated at the separation layer in the first and second separation steps.

In the separating method according to the 10th aspect, for example, the sample preferably comprises a plate member having a layer with a fragile structure as the separation layer.

In the separating method according to the 10th aspect, preferably, for example, the first region is a region at a periphery of the separation layer, and the second region is a region at a center of the separation layer.

In the separating method according to the 10th aspect, for example, the first separation step preferably comprises ejecting the fluid to the separation layer while rotating the sample about an axis perpendicular to the separation layer so as to mainly separate the first region.

In the separating method according to the 10th aspect, preferably, for example, the first and second separation steps comprise supporting the sample by the same support portion, and the second separation step comprises supplying the vibration energy from a portion where the support portion is in contact with the sample to the sample.

In the separating method according to the 10th aspect, preferably, for example, the support portion has a pair of opposing support surfaces for sandwiching a portion near a central portion of the sample from both sides and pressing the portion to support the sample, and the support surface has a substantially circular shape.

In the separating method according to the 10th aspect, preferably, for example, the first region is positioned substantially on an outer peripheral side of a region pressed by the support surfaces, and the second region is substantially the region pressed by the support surfaces.

In the separating method according to the 10th aspect, for example, the second separation step preferably comprises immersing the sample processed in the first separation step in a process tank and supplying the vibration energy to the sample via a liquid in the process tank.

In the separating method according to the 10th aspect, preferably, for example, the first separation step is executed first, and then, the second separation step is executed.

In the separating method according to the 10th aspect, preferably, for example, the second separation step is executed first, and then, the first separation step is executed.

In the separating method according to the 10th aspect, for example, at least part of the first and second separation steps are preferably parallelly executed.

According to the 11th aspect of the present invention, there is provided a separating method of separating a sample having a separation layer at the separation layer, characterized by comprising ejecting a fluid to the separation layer of the sample and simultaneously supplying a vibration energy to the sample to separate the sample.

In the separating method according to the 11th aspect, for example, the sample is preferably separated while rotating the sample about an axis perpendicular to the separation layer.

According to the 12th aspect of the present invention, there is provided a separating method of separating a sample having a separation layer at the separation layer, characterized by comprising ejecting a fluid to the separation layer of the sample and simultaneously supplying a vibration energy to a portion near a central portion of the sample to separate the sample.

In the separating method according to the 12th aspect, for example, the sample is preferably separated while rotating the sample about an axis perpendicular to the separation layer.

According to the 13th aspect of the present invention, there is provided a separating method of separating a sample having a separation layer at the separation layer, characterized by comprising ejecting a fluid to the separation layer of the sample and simultaneously supplying a vibration energy to the sample and the fluid injected into the sample to separate the sample.

In the separating method according to the 11th aspect, for example, the sample is preferably separated while rotating the sample about an axis perpendicular to the separation layer.

According to the 14th aspect of the present invention, there is provided a separating method of separating a sample having a separation layer at the separation layer, characterized by comprising ejecting a fluid to the separation layer of the sample while supporting a predetermined portion of the sample and simultaneously supplying a vibration energy to the predetermined portion of the sample to separate the sample.

In the separating method according to the 14th aspect, for example, the sample is preferably separated while rotating the sample about an axis perpendicular to the separation layer.

In the separating methods according to the 10th to 14th aspects, for example, the sample is formed by bonding a first plate member having a fragile layer to a second plate member.

In the separating methods according to the 10th to 14th aspects, for example, the fragile layer comprises a porous layer.

In the separating methods according to the 10th to 14th aspects, for example, the first plate member comprises a semiconductor substrate.

In the separating methods according to the 10th to 14th aspects, for example, the first plate member is formed by forming the porous layer on one surface of a semiconductor substrate and forming a non-porous layer on the porous layer.

In the separating methods according to the 10th to 14th aspects, for example, the non-porous layer includes a single-crystal semiconductor layer.

Further objects, features and advantages of the present invention will become apparent from the following detailed description of the embodiments of the present invention with reference to the accompanying drawings.

BRIEF DESCRIPTION OF THE DRAWINGS

FIG. 31 is a flow chart showing the control procedure of the processing system shown in FIGS. 29 and 30.

DETAILED DESCRIPTION OF THE PREFERRED EMBODIMENTS

FIGS. 1A to 1E are views for explaining the processes of manufacturing an SOI substrate according to a preferred embodiment of the present invention.

Figure 1A:
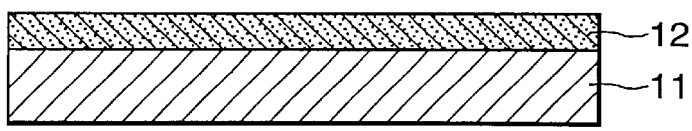
FIGS. 1A to 1E are views for explaining the processes of manufacturing an SOI substrate according to a preferred embodiment of the present invention.
Figure 1B:
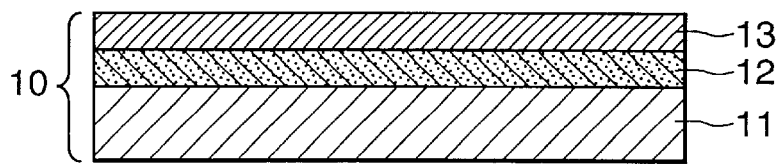

In the process shown in FIG. 1A, a single-crystal Si substrate 11 is prepared, and a porous Si layer 12 is formed on the surface of the single-crystal Si substrate 11 by anodizing. In the process shown in FIG. 1B, a non-porous single-crystal Si layer 13 is formed on the porous Si layer 12 by epitaxial growth. With this processing, a first substrate 10 is formed.

Figure 1C:
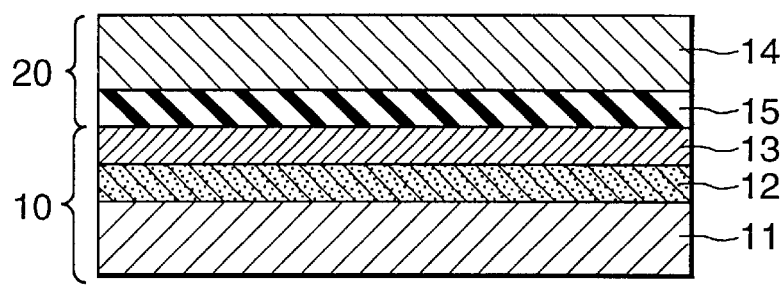

In the process shown in FIG. 1C, a second substrate 20 is prepared by forming an insulating layer (e.g., $SiO_2$ layer) 15 on the surface of a single-crystal Si substrate 14. The first substrate 10 and second substrate 20 are brought into tight contact with each other at room temperature such that the non-porous single-crystal Si layer 13 opposes the insulating layer 15. After this, the first substrate 10 and second substrate 20 are bonded by abode bonding, pressing, heating, or a combination thereof. With this processing, the non-porous single-crystal Si layer 13 and insulating layer 15 are firmly bonded. The insulating layer 15 may be formed on the single-crystal Si substrate 14 side, as described above, or on the non-porous single-crystal Si layer 13 or both of the non-porous single-crystal Si layer 13 and single-crystal Si substrate 14, as will be described later as far as the state shown in FIG. 1C is obtained when the first and second substrates are brought into tight contact with each other.

Figure 1D:
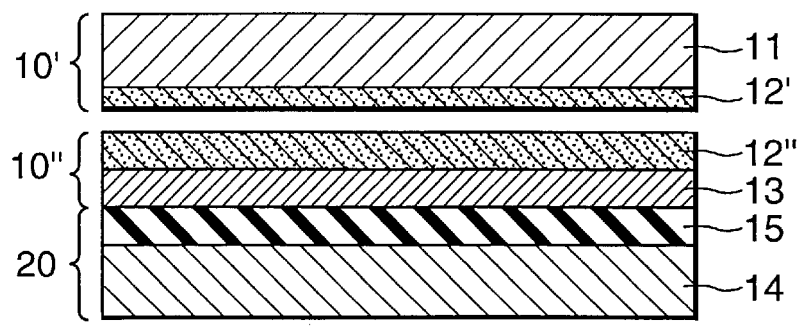

In the process shown in FIG. 1D, the bonded substrates are separated at the portion of the porous Si layer 12. The second substrate side (10"+20) has a multilayered structure of porous Si layer 12"/single-crystal Si layer 13/insulating layer 15/single-crystal Si substrate 14. On the first substrate 10' side, the porous Si layer 12' is formed on the single-crystal Si substrate 11.

For the substrate 10' after separation, the residual porous Si layer 12' is removed, and the surface is planarized as needed, so the substrate is reused as a single-crystal Si substrate 11 for forming another first substrate 10.

Figure 1E:
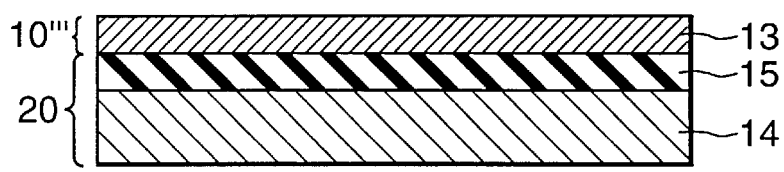

After separation of the bonded substrate stack, in the process shown in FIG. 1E, the porous layer 12" on the surface on the second substrate side (10"+20) is selectively removed. With this processing, a substrate having a multi-layered structure of single-crystal Si layer 13/insulating layer 15/single-crystal Si substrate 14, i.e., an SOI substrate can be obtained.

In this embodiment, in at least part of the process shown in FIG. 1D, i.e., the process of separating the bonded substrate stack, a separating apparatus for ejecting a liquid or gas (fluid) to the porous Si layer as a separation layer to separate the bonded substrate stack into two substrates at the separation layer is used.

FIGS. 20A to 20E are views for explaining the processes of manufacturing an SOI substrate according to another preferred embodiment of the present invention.

Figure 20A:
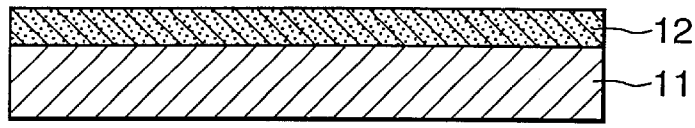
FIGS. 20A to 20E are views for explaining the processes of manufacturing an SOI substrate according to another preferred embodiment of the present invention.
Figure 20B:
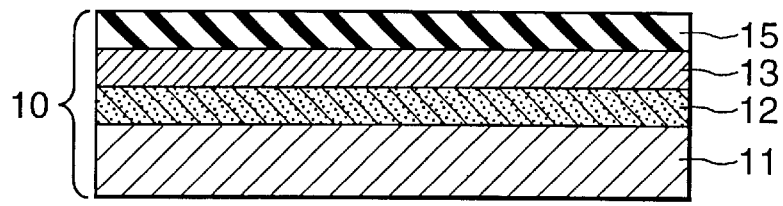

In the process shown in FIG. 20A, a single-crystal Si substrate 11 is prepared, and a porous Si layer 12 is formed on the surface of the single-crystal Si substrate 11 by anodizing. In the process shown in FIG. 20B, a non-porous single-crystal Si layer 13 is formed on the porous Si layer 12 by epitaxial growth, and an insulating layer (e.g., $SiO_1$ layer) 15 is formed on the non-porous single-crystal Si layer 13. With this processing, a first substrate 10 is formed.

Figure 20C:
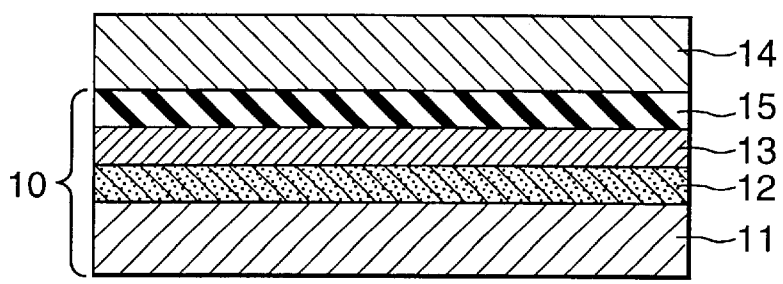

In the process shown in FIG. 20C, a second substrate 14 is prepared. The first substrate 10 and second substrate 14 are brought into tight contact with each other at room temperature such that the insulating layer 15 opposes the second substrate 14. After this, the first substrate 10 and second substrate 14 are bonded by abode bonding, pressing, heating, or a combination thereof. With this processing, the insulating layer 15 and second substrate 14 are firmly bonded.

Figure 20D:
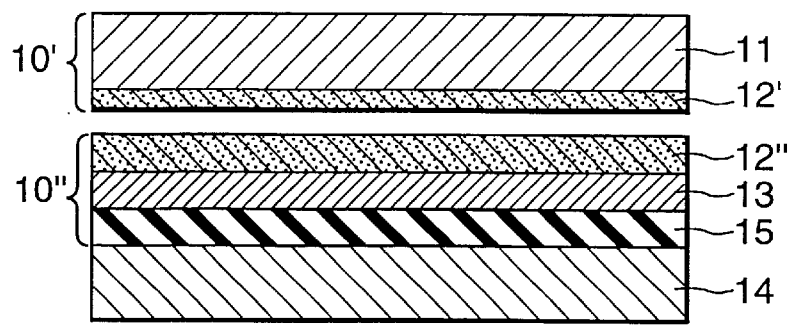

In the process shown in FIG. 20D, the two substrates bonded are separated at the portion of the porous Si layer 12. The second substrate side (10"+20) has a multilayered structure of porous Si layer 12"/single-crystal Si layer 13/insulating layer 15/single-crystal Si substrate 14. On the first substrate (10') side, the porous Si layer 12' is formed on the single-crystal Si substrate 11.

For the substrate 10' after separation, the residual porous Si layer 12' is removed, and the surface is planarized as needed, so the substrate is reused as a single-crystal Si substrate 11 for forming another first substrate 10.

Figure 20E:
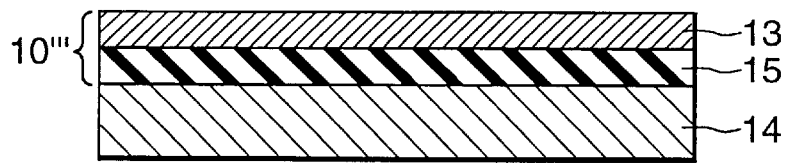

After separation of the bonded substrate stack, in the process shown in FIG. 20E, the porous layer 12" on the surface on the second substrate side (10"+20) is selectively removed. With this processing, a substrate having a multi-layered structure of single-crystal Si layer 13/insulating layer 15/single-crystal Si substrate 14, i.e., an SOI substrate can be obtained.

In this embodiment, in at least part of the process shown in FIG. 20D, i.e., the process of separating the bonded substrate stack, a separating apparatus for ejecting a liquid or gas (fluid) to the porous Si layer as a separation layer to separate the bonded substrate stack into two substrates at the separation layer is used.

[Basic Arrangement of Separating Apparatus]

This separating apparatus uses the water jet method. Generally, the water jet method ejects a high-speed, high-pressure stream of water (to cut a solid material, an abrasive is added) to an object to, e.g., cut or process a ceramic, metal, concrete, resin, rubber, or wood, remove a coating film from the surface, or clean the surface ("Water Jet", Vol. 1, No. 1, page 4 (1984)). Conventionally, the water jet method has been used to partially remove a material to cut, process, remove a coating film, or clean the surface.

This separating apparatus ejects a stream of fluid to the porous layer (separation region) as a fragile structure of a bonded substrate stack to selectively break the porous layer, thereby separating the substrate stack at the porous layer. The stream will be referred to as a "jet" hereinafter. The fluid forming a jet will be referred to as a "jet medium". As the jet medium, it is possible to use water, an organic solvent such as alcohol, an acid such as fluoric acid or nitric acid, an alkali such as potassium hydroxide, a gas such as air, nitrogen gas, carbonic acid gas, a rare gas, or an etching gas, or a plasma.

When this separating apparatus is applied to manufacture a semiconductor device or separate, e.g., a bonded substrate stack, pure water with minimum impurity metals or particles is preferably used as a jet medium.

In this separating apparatus, a jet is ejected to a porous layer exposed to the side surface of a bonded substrate stack, thereby removing the porous layer from the peripheral portion to the central portion. With this method, only the porous layer of the bonded substrate stack, which has a low mechanical strength, is removed without damaging the main body, and the bonded substrate stack is separated into two substrates.

Figure 2:
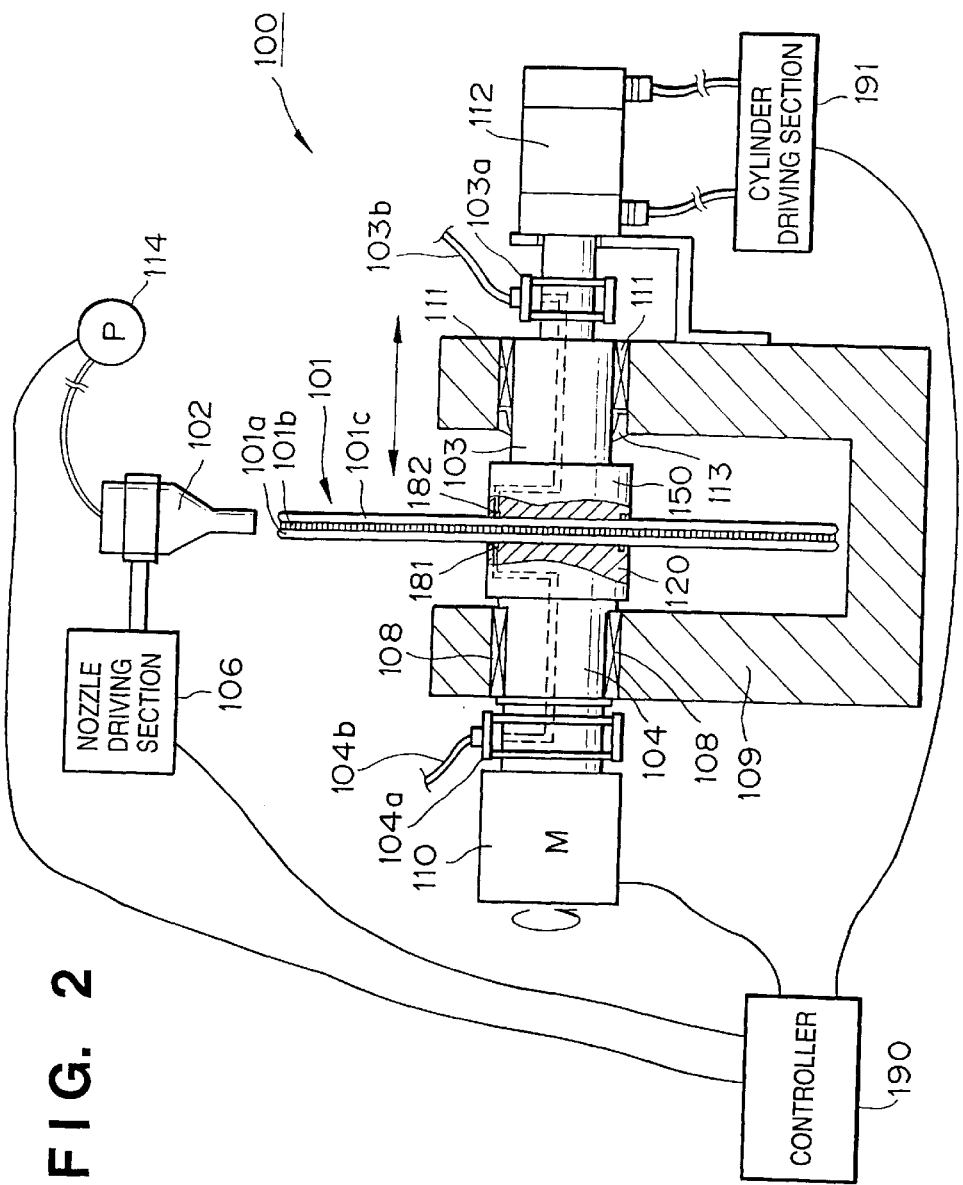
FIG. 2 is a view showing the schematic arrangement of a separating apparatus according to a preferred embodiment of the present invention.

FIG. 2 is a view showing the schematic arrangement of a separating apparatus according to a preferred embodiment of the present invention. A separating apparatus 100 has substrate holding portions 120 and 150 having vacuum chuck mechanisms. The substrate holding portions 120 and 150 sandwich a bonded substrate stack 101 from both sides and hold it. The bonded substrate stack 101 has a porous layer 101b as a fragile structure portion. The separating apparatus 100 separates the bonded substrate stack 101 into two substrates 101a and 101c at the porous layer 101b. In the separating apparatus 100, for example, the substrate 101a is set on the first substrate 10 side in FIG. 1C, and the substrate 101c is set on the second substrate side (10"+20) in FIG. 1C.

The substrate holding portions 120 and 150 are located on one rotary axis. The substrate holding portion 120 is coupled to one end of a rotary shaft 104 rotatably axially supported by a support table 109 via a bearing 108. The other end of the rotary shaft 104 is coupled to the rotary shaft of a motor 110. The bonded substrate stack 101 vacuum-chucked by the substrate holding portion 120 is rotated by a rotary force generated by the motor 110. The motor 110 is controlled by a controller 190 to rotate or stop the rotary shaft 104 at a rotational speed instructed from the controller 190.

The substrate holding portion 150 is coupled to one end of a rotary shaft 103 slidably and rotatably axially supported by the support table 109 via a bearing 111. The other end of the rotary shaft 103 is coupled to an air cylinder 112 fixed to the support table 109. The air cylinder 112 is driven by a cylinder driving section 191 controlled by the controller 190. When the air cylinder 112 pushes the rotary shaft 103, the bonded substrate stack 101 is pressed by the substrate holding portion 150. A sealing member 113 is fixed to the support table 109 to cover the outer surface of the rotary shaft 103. The sealing member 113 is formed from, e.g., a rubber to prevent a jet medium from entering the bearing 111 side.

The substrate holding portions 120 and 150 have one or a plurality of suction holes 181 and 182 as vacuum chuck mechanisms, respectively. The suction holes 181 and 182 communicate with rotary sealing portions 104a and 103a through the rotary shafts 104 and 103, respectively. The rotary sealing portions 104a and 103a are coupled to vacuum lines 104b and 103b, respectively. The vacuum lines 104b and 103b have solenoid valves for controlling attachment/detachment of the bonded substrate stack 101 or separated substrates. The solenoid valves are controlled by the controller 190.

Basic separation processing using the separating apparatus 100 and problems of this processing will be described below. Next, improved separation processing using the separating apparatus 100 will be described as the first mode of the present invention. An improved separating apparatus and separation processing will be described next as the second mode of the present invention.

[Basic Separation Processing]

First, the rotary shaft 103 is retracted in the air cylinder 112 to separate the suction surfaces of the substrate holding portions 120 and 150 by an appropriate distance. The bonded substrate stack 101 is conveyed to the space between the substrate holding portions 120 and 150 by a conveyor robot or the like, and the center of the bonded substrate stack 101 and the central axes of the rotary shafts 104 and 103 are aligned. The controller 190 causes the air cylinder 112 to push the rotary shaft 103, so the bonded substrate stack 101 is pressed and held (state shown in FIG. 2).

The controller 190 controls the motor 110 to rotate the bonded substrate stack 101 at a predetermined rotational speed. The rotary shaft 104, substrate holding portion 120, bonded substrate stack 101, substrate holding portion 150, and rotary shaft 103 integrally rotate.

The controller 190 controls a pump 114 to send a jet medium (e.g., water) to a nozzle 102 and waits until the jet ejected from the nozzle 102 stabilizes. When the jet stabilizes, the controller 190 controls a nozzle driving section 106 to move the nozzle 102 onto the center of the bonded substrate stack 101 to inject the jet into the porous layer 101b of the bonded substrate stack 101.

When the jet is injected, a separating force as the pressure of the jet medium continuously injected into the porous layer 101b as a fragile structure acts on the bonded substrate stack 101 to break the porous layer 101b that couples the substrates 101a and 101c. With this processing, the bonded substrate stack 101 can be completely separated in, e.g., several minutes.

When the bonded substrate stack 101 is separated into two substrates, the controller 190 controls, the nozzle driving section 106 to move the nozzle 102 to a standby position and then stop operation of the pump 114. The controller 190 also controls the motor 110 to stop rotating the bonded substrate stack 101. The controller 190 controls the above-described solenoid valves to cause the substrate holding portions 120 and 150 to vacuum-chuck the separated substrates 101a and 101c.

Next, the controller 190 causes the air cylinder 112 to retract the rotary shaft 103. The two substrates, which are physically separated, are separated from each other by breaking the surface tension of the jet medium (e.g., water).

According to the above-described separation processing, the bonded substrate stack 101 can be efficiently separated with minimum damage or contamination of the substrates. Hence, this separation processing is very promising for separation of a bonded substrate stack or other similar materials. However, the following problems remain unsolved.

[Problems of Separation Processing]

Figure 3:
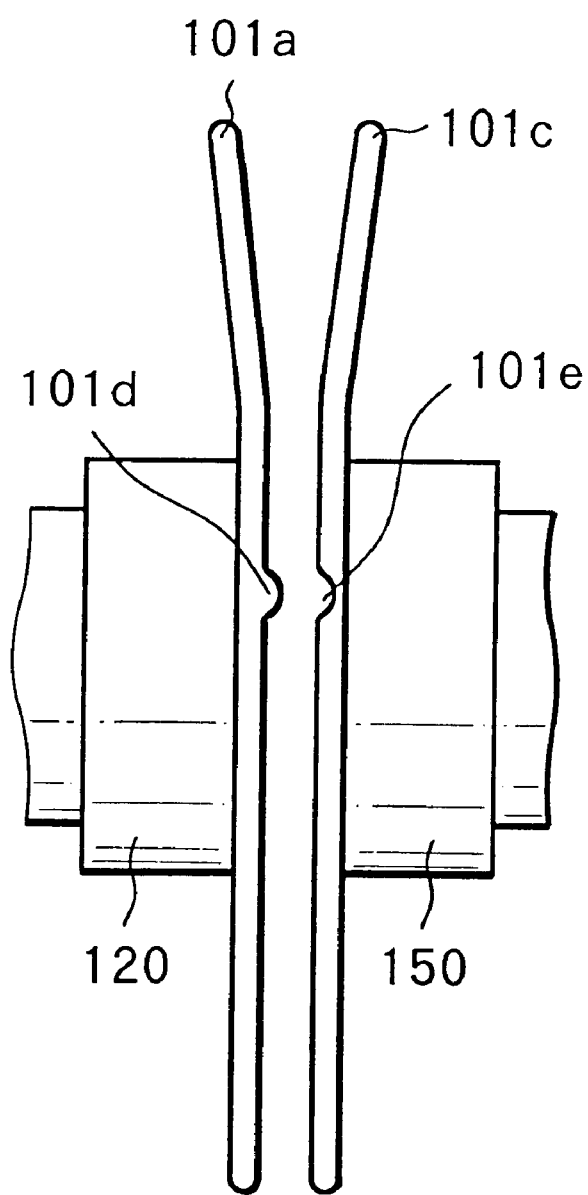
FIG. 3 is a view schematically showing defects that may be produced by processing of separating a bonded substrate stack into two substrates while rotating the bonded substrate stack at a constant speed.

FIG. 3 is a view schematically showing defects 101d and 101e that may be generated by the above separation processing, i.e., processing of separating a bonded substrate stack into two substrates using a jet while pressing and holding the central portion of the bonded substrate stack from both sides and rotating it at a constant speed. The defects 101d and 101e are produced at a portion where the bonded substrate stack 101 is separated by the final process of separation processing.

If such defects 101d and 101e are large, a layer (e.g., the single-crystal Si layer 13 shown in FIGS. 1B and 20B) adjacent to the porous layer (porous layer 101b in FIG. 3 or porous layer 12 in FIGS. 1C and 20C) is damaged, and the separated substrate cannot be used in the next process (e.g., process shown in FIG. 1E or 20E).

The defects 101d and 101e are generated probably due to the following reasons.

In separating the bonded substrate stack 101, first, a pressing force by the substrate holding portion 150 (air cylinder 112) acts on the bonded substrate stack 101 in a direction to sandwich the bonded substrate stack 101. Second, a force (separating force) for expanding the bonded substrate stack 101 acts due to the jet medium injected into the gap formed by separating the bonded substrate stack 101. Third, a bonding force (reaction against the separating force) of the porous layer 101b in the unseparated region of the bonded substrate stack 101 acts. The pressing force by the air cylinder 112 is maintained to be substantially constant. On the other hand, the separating force abruptly increases as the separated region of the bonded substrate stack becomes large. Naturally, the bonding force decreases as the unseparated region becomes small.

Also, the above separation processing is executed while holding the central portion of the bonded substrate stack by the substrate holding portions 120 and 150. For this reason, the outer peripheral region of the bonded substrate stack 101 largely warps due to the pressure of the jet medium when the region is separated. However, the warp amount of the central region of the bonded substrate stack 101 is small. When the warp amount is large, i.e., when the outer peripheral portion of the bonded substrate stack 101 is to be separated, the separating force mainly acts on part of the periphery of the unseparated region and separation gradually progresses. On the other hand, when the warp amount is small, i.e., when the central portion (region held by the substrate holding portions) of the bonded substrate stack 101 is to be separated, the substrate holding portion retreats, and the separating force acts on the entire central portion of the bonded substrate stack 101. For this reason, separation perhaps progresses while peeling the unseparated region altogether.

According to this supposition, when the outer peripheral portion of the bonded substrate stack is being separated, the relationship (bonding force)+(pressing force)>>(separating force) is maintained. No excessive separating force acts on the bonded substrate stack, and the separating force mainly acts on part of the peripheral portion of the unseparated region. Hence, the unseparated region is gradually separated by the weak separating force and jet impact.

However, when separation progresses, and the relationship (bonding force)+(pressing force)<(separating force)

holds, the substrate holding portion 150 starts retreating. For this reason, the separating force more efficiently acts on the bonded substrate stack to accelerate separation. At the final stage of separation processing, i.e., when the central portion of the bonded substrate stack 101 to be separated, (bonding force)+(pressing force)<<(separating force) holds because the bonding force weakens, and the separating force abruptly increases. The substrate holding portion 150 retreats at once, and an excessive separating force acts on the entire unseparated region. At this time, it is possibly not the case that the bonded substrate stack 101 is finally separated by the jet impact but that the entire unseparated region is peeled altogether mainly by the separating force, i.e., the force with which the jet medium injected into the gap formed by separating the bonded substrate stack expands the bonded substrate stack.

To summarize, the above defects are probably generated because the region held by the substrate holding portions (central portion in the above example) is mainly separated by the separating force (pressure of jet medium).

[First Mode]

Improved separation processing for reducing defects by separation processing will be described below as the first mode of the present invention.

The present inventor has found on the basis of experiments that the above defects can be reduced by the following method.

In the first process, the bonded substrate stack 101 is partially separated such that a predetermined region of the porous layer 101b is left as an unseparated region. The unseparated region is preferably substantially circular, and the position of the unseparated region is preferably at substantially the central portion of the bonded substrate stack 101.

In the second process, a force is applied to the unseparated region not from all directions but from a predetermined direction to completely separate the bonded substrate stack 101. When a force is applied to the unseparated region from a predetermined direction, the separation region can be gradually widened while applying a strong separating force to part of the peripheral portion of the unseparated region and a weak separating force to the remaining portion. Hence, as compared to a case wherein the unseparated region is separated at once, defects in separated substrates can be effectively prevented.

Preferred embodiments of improved separation processing will be described below.

(First Embodiment)

In this embodiment, in the first process, a nozzle 102 is moved to the center of a bonded substrate stack 101, and the peripheral portion of the bonded substrate stack 101 is separated, and the central portion is left as an unseparated region while rotating the bonded substrate stack 101 by a motor 110 (e.g., at 8 rpm). Separation processing is executed while rotating the bonded substrate stack 101 because the shape and position of an unseparated region 202 remaining after the first process must be uniform for a number of bonded substrate stacks. With this arrangement, the bonded substrate stacks 101 can be processed under substantially the same conditions in the second process.

Figure 4:
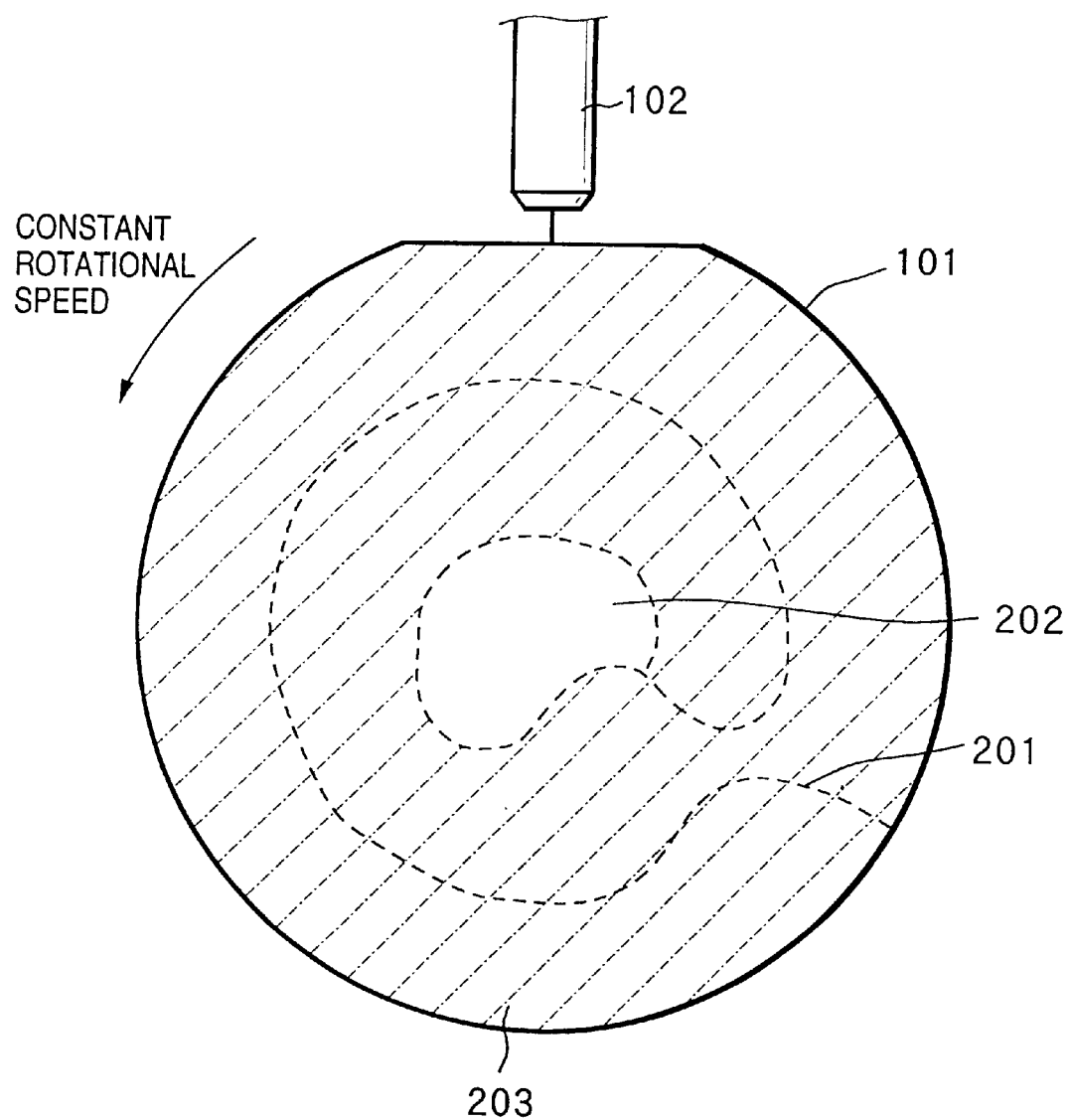
FIG. 4 is a view schematically showing a state wherein a bonded substrate stack is partially separated in the first process according to the first embodiment of the first mode.

FIG. 4 is a view schematically showing a state wherein the bonded substrate stack 101 is partially separated in the first process of this embodiment. Referring to FIG. 4, reference numeral 201 denotes a boundary between the separation region and unseparated region during the first process. The region outside the boundary 201 is an already separated region, and the region inside the boundary 201 is an unseparated region. In the first process of this embodiment, since separation processing progresses while rotating the bonded substrate stack 101, the locus of the boundary 201 has a spiral shape. The region 202 without hatching is the unseparated region remaining after the first process. The unseparated region 202 has a substantially circular shape and is located at substantially the central portion of the bonded substrate stack 101. A hatched region 203 is the region (separation region) separated by executing the first process. The unseparated region 202 is preferably smaller than the separation region 203.

When the first process is executed while rotating the bonded substrate stack 101, a desired region, e.g., the central portion of the bonded substrate stack 101 can be left as the unseparated region 202. For this reason, the second process can be executed for the bonded substrate stacks 101 under substantially the same conditions.

In the second process, the unseparated region 202 is separated while reducing the rotational speed of the bonded substrate stack 101 and substantially stops rotation (e.g., at 2 rpm or less) or completely stopping rotating the bonded substrate stack 101. In this case, a force can be applied to the unseparated region 202 from a predetermined direction. Most preferably, rotation of the bonded substrate stack 101 is completely stopped.

Figure 5:
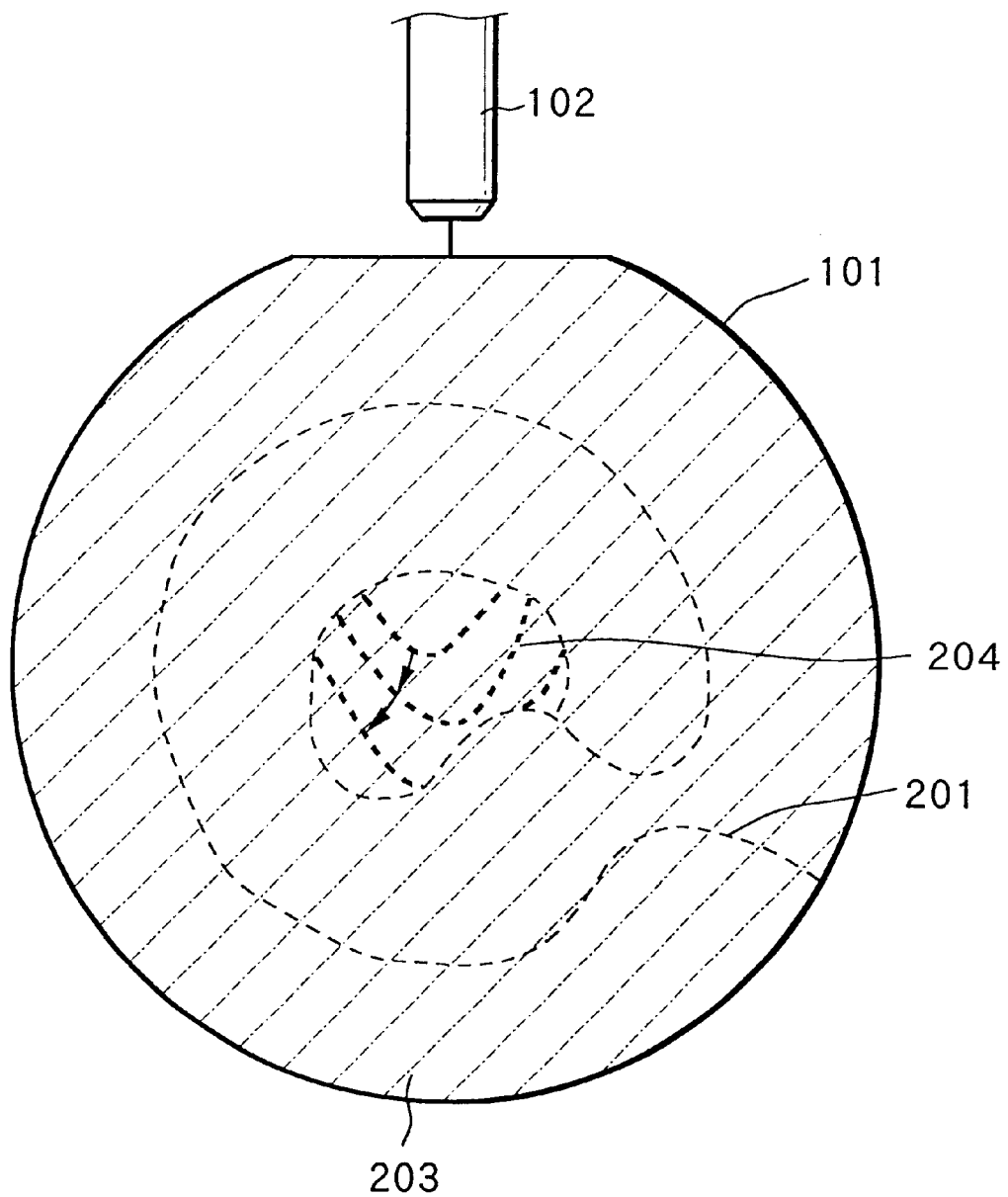
FIG. 5 is a view schematically showing a state wherein a bonded substrate stack is completely separated in the second process according to the first embodiment of the first mode.

FIG. 5 is a view schematically showing a state wherein the bonded substrate stack 101 is completely separated in the second process of this embodiment. Referring to FIG. 5, reference numeral 204 denotes a boundary between a separation region and an unseparated region during the second process. The boundary 204 moves as indicated by an arrow.

When a jet is injected into the gap of the bonded substrate stack 101 while substantially stopping rotating the bonded substrate stack 101, a force can be applied to the unseparated region 202 from a predetermined direction. Since the separation region can be gradually widened while applying a strong separating force to part of the peripheral portion of the unseparated region 202 and a weak separating force to the remaining portion, defects in separated substrates can be prevented.

Figure 6:
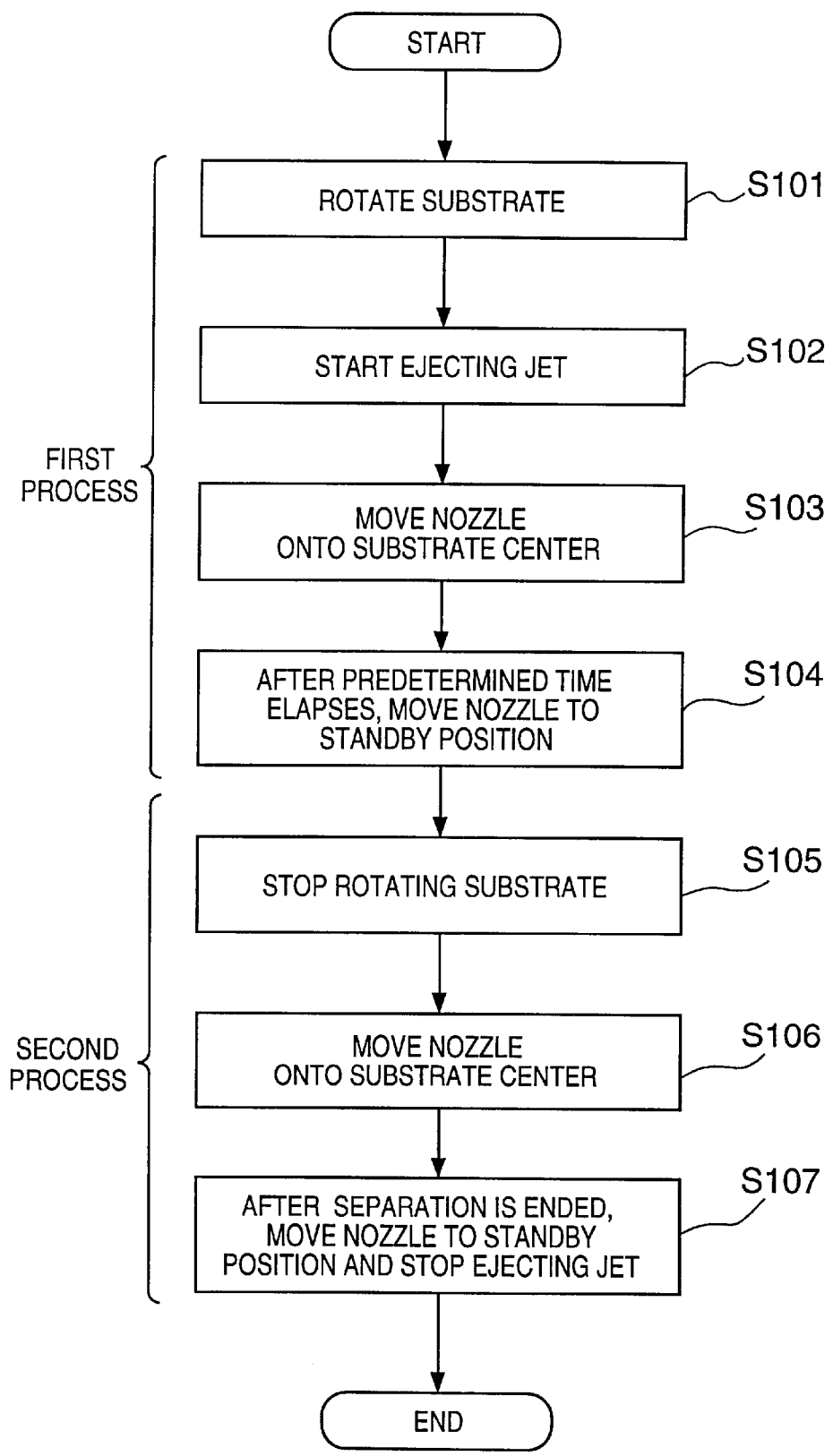
FIG. 6 is a flow chart schematically showing the control procedure of a separating apparatus according to the first embodiment of the first mode.

FIG. 6 is a flow chart schematically showing the control procedure of a separating apparatus 100 according to this embodiment. Processing shown in this flow chart is controlled by a controller 190. Processing shown in this flow chart is executed after a bonded substrate stack 101 is set in the separating apparatus 100, i.e., after a bonded substrate stack 101 is held by substrate holding portions 120 and 150.

Steps S101 to S104 correspond to the first process. First, the controller 190 controls the motor 110 to rotate the bonded substrate stack 101 at a predetermined rotational speed (S101). The rotational speed is preferably about 4 to 12 rpm and, more preferably, about 6 to 10 rpm. In this embodiment, the rotational speed is set to be 8 rpm.

Next, the controller 190 controls a pump 114 to eject a jet having a predetermined pressure (e.g., 500 kgf/cm$^2$) from a nozzle 102 (S102). Then, the controller 190 controls a nozzle driving section 106 to move the nozzle 102 from the standby position (where the jet does not collide against the bonded substrate stack 101) onto a porous layer 101b on the central axis of the bonded substrate stack 101 (S103). Partial separation of the bonded substrate stack 101 is started. After the region other than the unseparated region 202 to be left is separated (e.g., after a predetermined time elapses), the controller 190 controls the nozzle driving section 106 to move the nozzle 102 to the standby position (S104). The first process is ended.

Steps S105 to S107 correspond to the second process. First, the controller 190 controls the motor 110 to substantially stop rotating the bonded substrate stack 101 (S105). Next, the controller 190 controls the nozzle driving section 106 to move the nozzle 102 from the standby position onto the porous layer 101b on the central axis of the bonded substrate stack 101 (S106). Separation of the unseparated region 202 of the bonded substrate stack 101 is started. After the bonded substrate stack 101 is completely separated (e.g., after a predetermined time elapses), the controller 190 controls the nozzle driving section 106 to move the nozzle 102 to the standby position and controls the pump 114 to stop ejecting the jet (S107). The second process is ended.

(Second Embodiment)

The second embodiment is related to a method of more satisfactorily controlling the shape and position of the unseparated region left after the first process. The first process of this embodiment is the same as that of the first embodiment in that a nozzle 102 is positioned on the center of a bonded substrate stack 101, the peripheral portion of the bonded substrate stack 101 is separated and the central portion is left as an unseparated region while rotating the bonded substrate stack 101 by a motor 110.

However, the first process of this embodiment is different from that of the first embodiment in that the bonded substrate stack 101 is partially separated while increasing the rotational speed of the bonded substrate stack 101 gradually or stepwise (including in two steps). For example, the bonded substrate stack 101 is rotated at a low speed until the bonded substrate stack 101 rotates by about one revolution after the start of separation (first step), and after this, the rotational speed is preferably increased (second step).

The rotational speed of the bonded substrate stack 101 in the first step is preferably, e.g., about 4 to 12 rpm and, more preferably, 6 to 10 rpm. In this embodiment, the rotational speed is set to be 8 rpm. The rotational speed of the bonded substrate stack 101 in the second step is preferably, e.g., about 25 to 35 rpm and, more preferably, about 28 to 32 rpm. In this embodiment, the rotational speed is set to be 30 rpm.

The bonded substrate stack 101 is rotated at a low speed at the initial stage of the first process because the separating force cannot efficiently act on the bonded substrate stack 101 at the initial stage. The first process is executed while increasing the rotational speed gradually or stepwise because an unseparated region close to a point-symmetrical shape can be left by rotating the bonded substrate stack 101 at a high speed.

Figure 7:
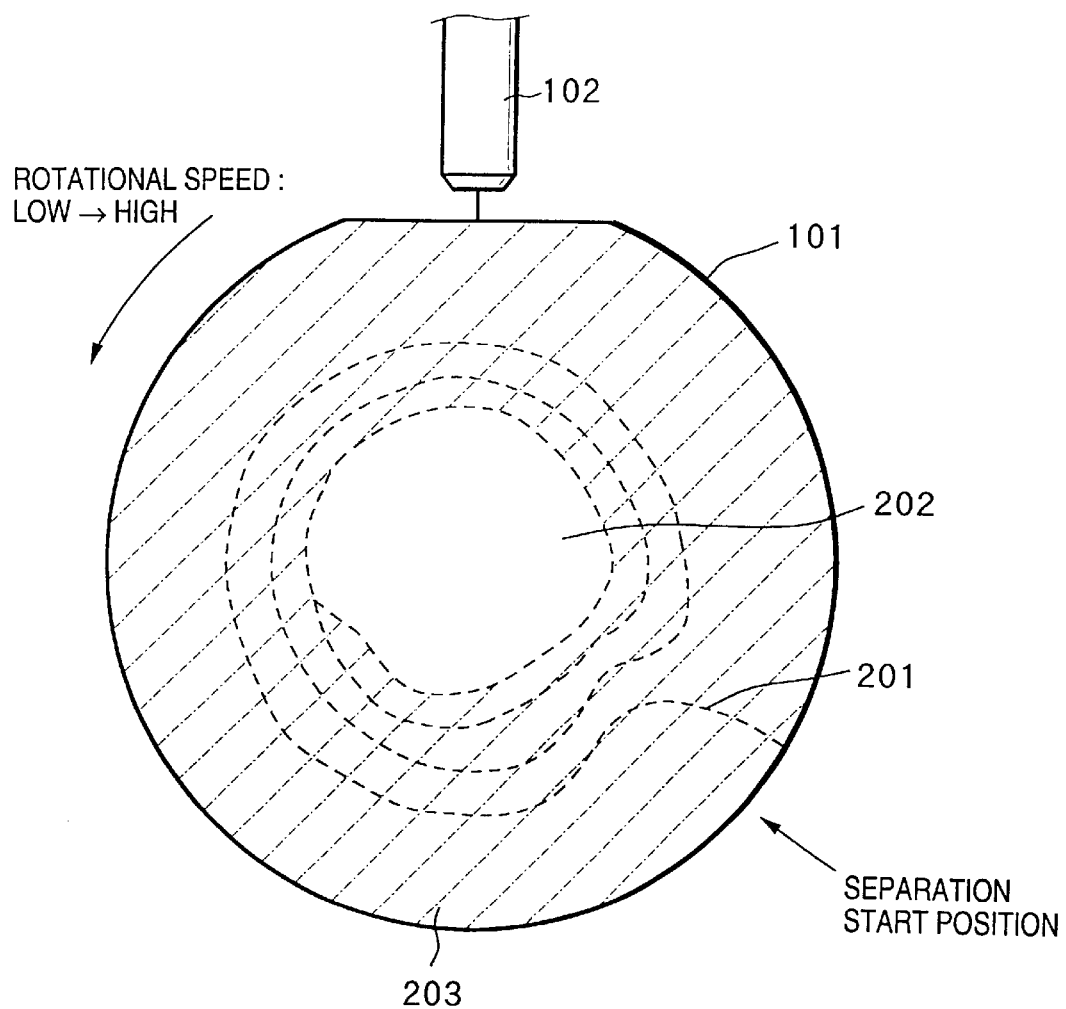
FIG. 7 is a view schematically showing a state wherein a bonded substrate stack is partially separated in the first process according to the second embodiment of the first mode.

FIG. 7 is a view schematically showing a state wherein the bonded substrate stack 101 is partially separated in the first process according of the second embodiment. In the example shown in FIG. 7, the bonded substrate stack 101 is rotated at about 8 rpm until it rotates by about one revolution, and after this, the rotational speed is increased to about 30 rpm.

Figure 8:
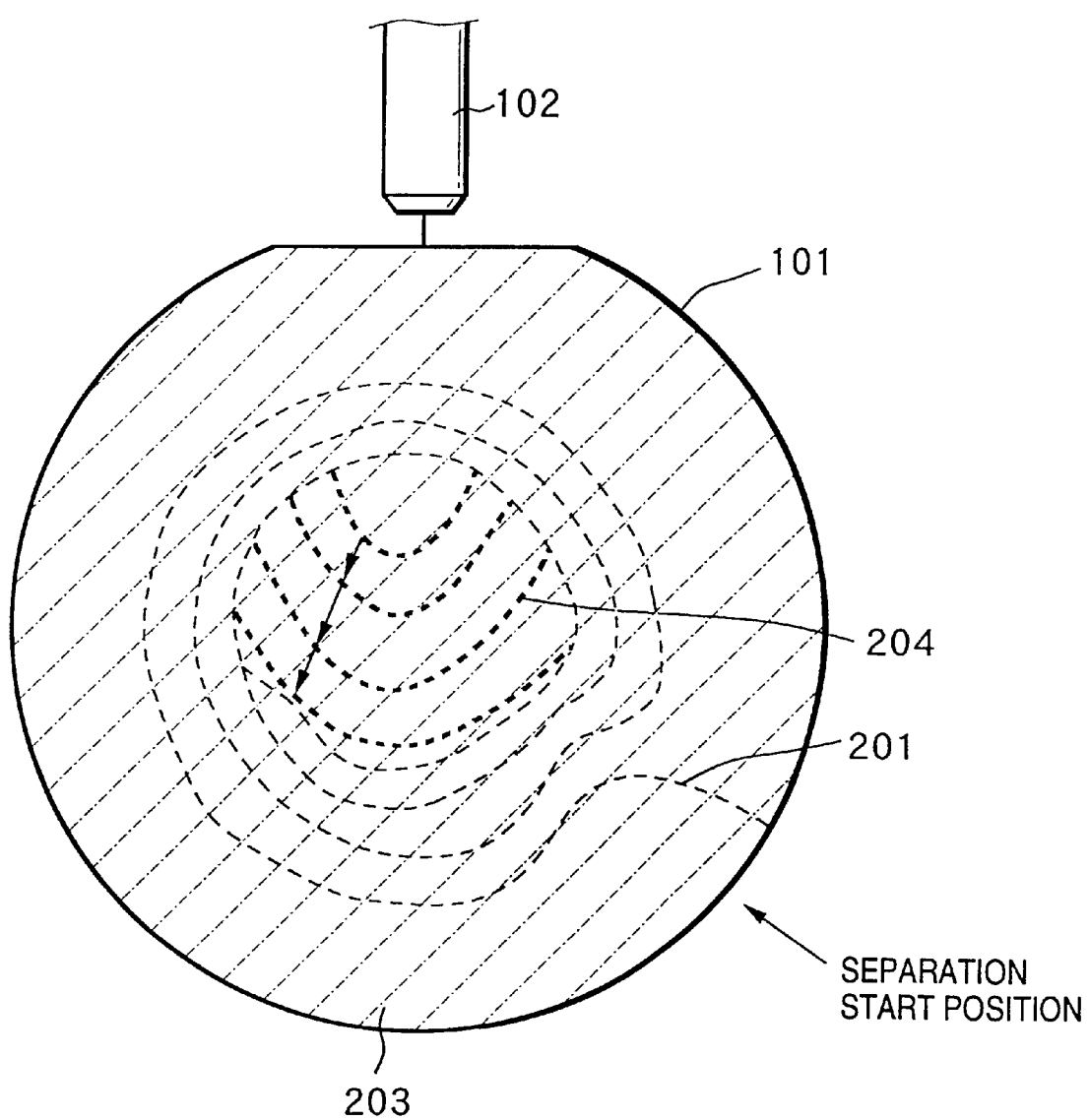
FIG. 8 is a view schematically showing a state wherein a bonded substrate stack is completely separated in the second process according to the second embodiment of the first mode.

The second process of this embodiment is the same as in the first embodiment. FIG. 8 is a view schematically showing a state wherein the bonded substrate stack 101 is completely separated in the second process of the second embodiment.

When the rotational speed of the bonded substrate stack 101 is increased gradually or stepwise in the first process, an unseparated region 202 left after the first process can be made close to a circular shape, and the position of the unseparated region 202 can be matched with the center of the bonded substrate stack 101. This means that the shapes of the unseparated regions 202 of the bonded substrate stacks 101 can be further uniformed. Hence, as compared to the first embodiment, defects that may be generated in the second process can be reduced.

Figure 9:
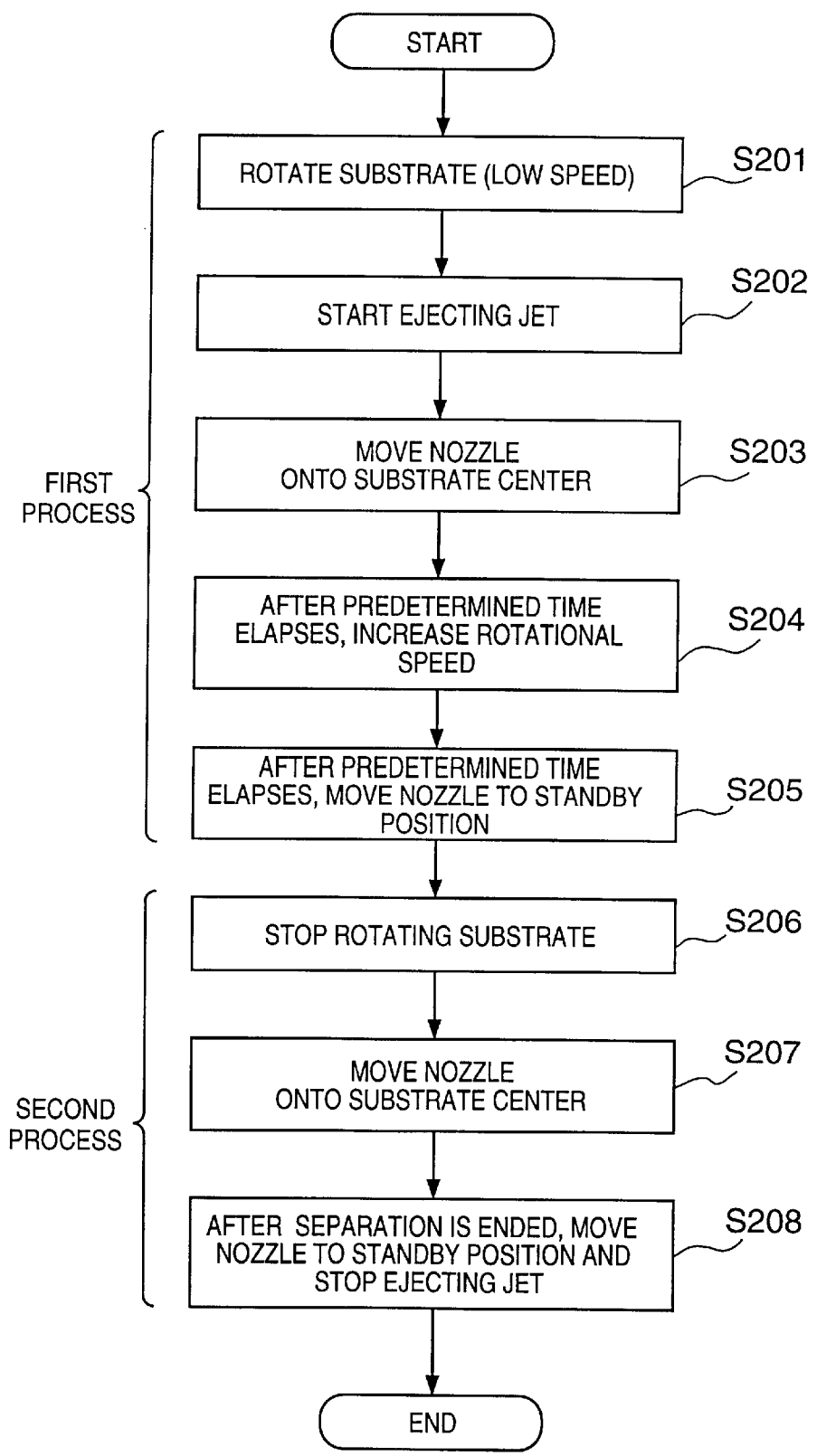
FIG. 9 is a flow chart schematically showing the control procedure of a separating apparatus according to the second embodiment of the first mode.

FIG. 9 is a flow chart schematically showing the control procedure of a separating apparatus 100 according to the second embodiment. Processing shown in this flow chart is controlled by a controller 190. Processing shown in this flow chart is executed after a bonded substrate stack 101 is set in the separating apparatus 100.

Steps S201 to S205 correspond to the first process. First, the controller 190 controls the motor 110 to rotate the bonded substrate stack 101 at a low speed (S201). The rotational speed at this time is preferably, e.g., about 4 to 12 rpm and, more preferably, about 6 to 10 rpm. In this embodiment, the rotational speed is set to be 8 rpm.

Next, the controller 190 controls a pump 114 to eject a jet having a predetermined pressure (e.g., 500 kgf/cm$^2$) from a nozzle 102 (S202). Then, the controller 190 controls a nozzle driving section 106 to move the nozzle 102 from the standby position onto a porous layer 101b on the central axis of the bonded substrate stack 101 (S203). Partial separation of the bonded substrate stack 101 is started.

The controller 190 waits until the bonded substrate stack 101 rotates by, e.g., one revolution and controls the motor 110 to increase the rotational speed of the bonded substrate stack 101 (S204). At this time, the rotational speed is preferably about 25 to 35 rpm and, more preferably, about 28 to 32 rpm. In this embodiment, the rotational speed is set to be 30 rpm.

After the region other than the unseparated region 202 to be left is separated (e.g., after a predetermined time elapses), the controller 190 controls the nozzle driving section 106 to move the nozzle 102 to the standby position (S205). The first process is ended.

Steps S206 to S208 correspond to the second process. First, the controller 190 controls the motor 110 to substantially stop rotating the bonded substrate stack 101 (S206). Next, the controller 190 controls the nozzle driving section 106 to move the nozzle 102 from the standby position onto the porous layer 101b on the central axis of the bonded substrate stack 101 (S207). Separation of the unseparated region 202 of the bonded substrate stack 101 is started.

After the bonded substrate stack 101 is completely separated (e.g., after a predetermined time elapses), the controller 190 controls the nozzle driving section 106 to move the nozzle 102 to the standby position and controls the pump 114 to stop ejecting the jet (S208). The second process is ended.

(Third Embodiment)

The third embodiment is also related to a method of more satisfactorily controlling the shape and position of the unseparated region remaining after the first process. The first process of this embodiment is the same as that of the first embodiment in that a nozzle 102 is positioned on the center of a bonded substrate stack 101, the peripheral portion of the bonded substrate stack 101 is separated and the central portion is left as an unseparated region while rotating the bonded substrate stack 101 by a motor 110. However, the first process of this embodiment is different from that of the first embodiment in that the bonded substrate stack 101 is partially separated while reducing the jet pressure gradually or stepwise (including in two steps). For example, preferably, the jet pressure is set to be high (e.g., about 500 kgf/cm$^2$) until the bonded substrate stack 101 rotates by about one revolution after the start of separation, and after this, a jet pressure (e.g., about 220 kgf/cm$^2$) at which the central portion left as an unseparated region is not separated is set.

The jet pressure is set to be high at the initial stage of the first process because the separating force cannot efficiently act on the bonded substrate stack 101 at the initial stage. The first process is executed while reducing the jet pressure gradually or stepwise because an unseparated region close to a point-symmetrical shape can be left by setting a low jet pressure.

Figure 10:
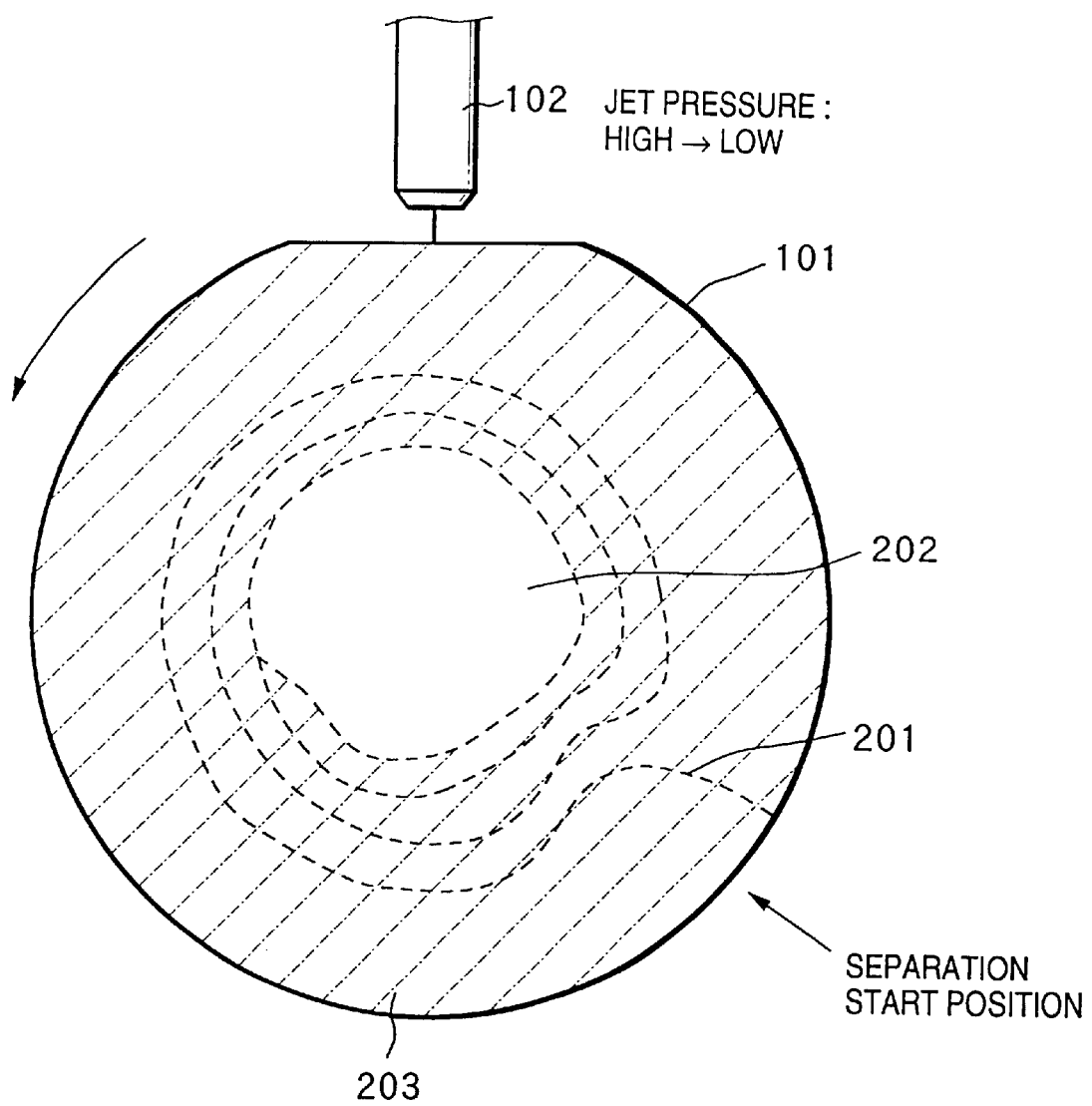
FIG. 10 is a view schematically showing a state wherein a bonded substrate stack is partially separated in the first process according to the third embodiment of the first mode.

FIG. 10 is a view schematically showing a state wherein the bonded substrate stack 101 is partially separated in the first process of the third embodiment. In the example shown in FIG. 10, the jet pressure is set to be 500 kgf/cm² until the bonded substrate stack 101 rotates by about one revolution, and after this, the jet pressure is set to be 220 kgf/cm².

The second process of the third embodiment is the same as that of the first embodiment. Separation of the bonded substrate stack 101 in the second process is substantially the same as that shown in FIG. 8.

In the first process, when the jet pressure is reduced gradually or stepwise, an unseparated region 202 remaining after the first process can be made close to a circular shape, and the position of the unseparated region 202 can be matched with the center of the bonded substrate stack. This means that the shapes of the unseparated regions 202 of the bonded substrate stacks 101 can be further uniformed. Hence, as compared to the first embodiment, defects that may be generated in the second process can be reduced.

Figure 11:
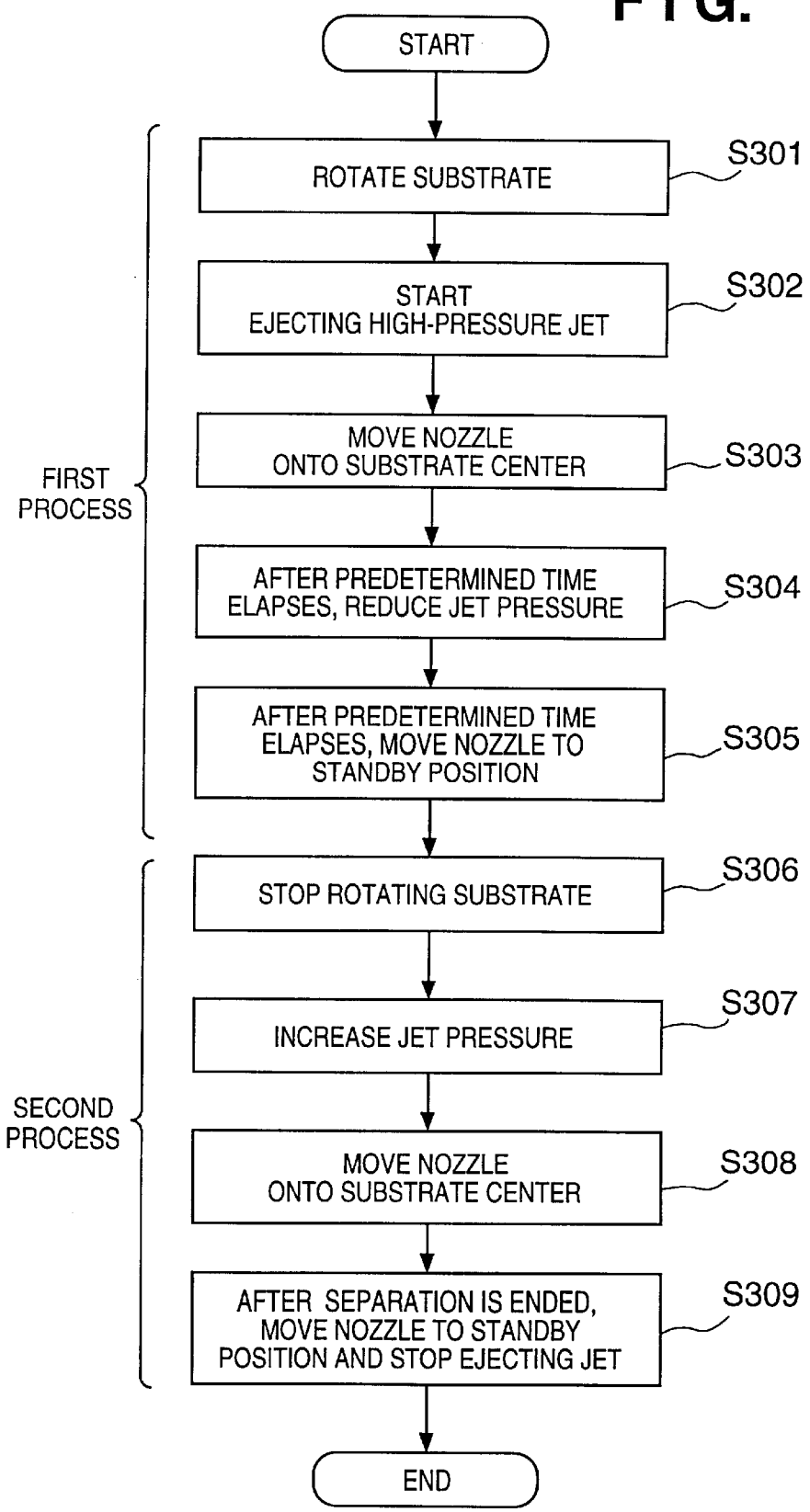
FIG. 11 is a flow chart schematically showing the control procedure of a separating apparatus according to the third embodiment of the first mode.

FIG. 11 is a flow chart schematically showing the control procedure of a separating apparatus 100 according to the third embodiment. Processing shown in this flow chart is executed after the bonded substrate stack 101 is set in the separating apparatus 100.

Steps S301 to S305 correspond to the first process. First, a controller 190 controls the motor 110 to rotate the bonded substrate stack 101 at a predetermined speed (S301). The rotational speed at this time is preferably, e.g., about 4 to 12 rpm and, more preferably, about 6 to 10 rpm. In this embodiment, the rotational speed is set to be 8 rpm.

Next, the controller 190 controls a pump 114 to eject a jet having a high pressure (e.g., 500 kgf/cm²) from a nozzle 102 (S302). Then, the controller 190 controls a nozzle driving section 106 to move the nozzle 102 from the standby position onto a porous layer 101b on the central axis of the bonded substrate stack 101 (S303). Partial separation of the bonded substrate stack 101 is started. After this, the controller 190 waits until the bonded substrate stack 101 rotates by, e.g., one revolution and controls the pump 114 to set a low jet pressure (e.g., 220 kgf/cm²) (S304).

After the region other than the unseparated region 202 to be left is separated (e.g., after a predetermined time elapses), the controller 190 controls the nozzle driving section 106 to move the nozzle 102 to the standby position (S305). The first process is ended.

Steps S306 to S309 correspond to the second process. First, the controller 190 controls the motor 110 to substantially stop rotating the bonded substrate stack 101 (S306). Next, the controller 190 controls the pump 114 to set a high jet pressure (e.g., 500 kgf/cm²) at which the unseparated region 202 can be separated (S307).

The controller 190 controls the nozzle driving section 106 to move the nozzle 102 from the standby position onto the porous layer 101b on the central axis of the bonded substrate stack 101 (S308). Separation of the unseparated region 202 of the bonded substrate stack 101 is started. After the bonded substrate stack 101 is completely separated (e.g., after a predetermined time elapses), the controller 190 controls the nozzle driving section 106 to move the nozzle 102 to the standby position and controls the pump 114 to stop ejecting the jet (S309). The second process is ended.

The second and third embodiments may be combined. More specifically, in the first process, at the initial stage of separation (e.g., for the first revolution), the bonded substrate stack 101 is separated using a high-pressure jet while rotating the bonded substrate stack 101 at a low speed. After this, separation is continued while increasing the rotational speed of the bonded substrate stack 101 gradually or stepwise, and simultaneously, reducing the jet pressure gradually or stepwise. With this process, the unseparated region 202 to be left after the first process can be more uniformed.

(Fourth Embodiment)

The fourth embodiment is also related to a method of more satisfactorily controlling the shape and position of the unseparated region left after the first process. In the first process of this embodiment, a nozzle 102 is set at a position shifted from the center of a bonded substrate stack 101 by a predetermined distance (e.g., 20 to 30 mm in a direction perpendicular to the jet ejecting direction), and the peripheral portion of the bonded substrate stack 101 is separated and the central portion is left as an unseparated region while rotating the bonded substrate stack 101 by a motor 110 (e.g., at 8 rpm). The jet is ejected to the position shifted from the center of the bonded substrate stack 101 to further uniform the shapes and positions of unseparated regions 202 of a number of bonded substrate stacks 101, which remain after the first process.

Figure 12:
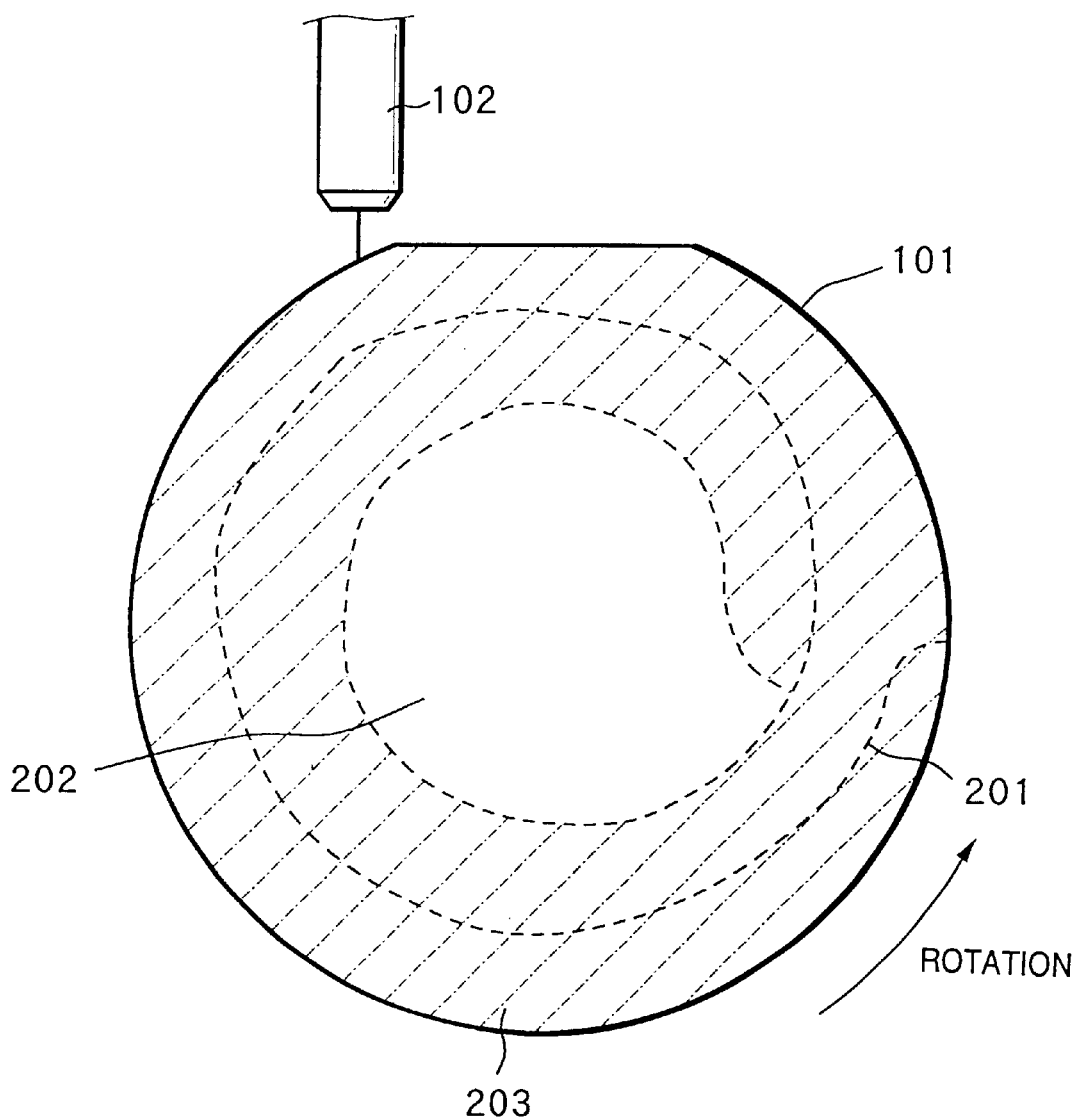
FIG. 12 is a view schematically showing a state wherein a bonded substrate stack is partially separated in the first process according to the fourth embodiment of the first mode.

FIG. 12 is a view schematically showing a state wherein the bonded substrate stack is partially separated in the first process of this embodiment. Referring to FIG. 12, reference numeral 201 denotes a boundary between the separation region and unseparated region during the first process. The region outside the boundary 201 is an already separated region, and the region inside the boundary 201 is an unseparated region. In the first process of this embodiment, since separation processing progresses while rotating the bonded substrate stack 101, the locus of the boundary 201 has a spiral shape. The region 202 without hatching is the unseparated region remaining after the first process. The shape of the unseparated region 202 is closer to a circular shape, and the center is closer to the center of the bonded substrate stack 101, as compared to the first embodiment. A hatched region 203 is the region separated by executing the first process. The unseparated region 202 can be made close to a point-symmetrical shape, as compared to the first embodiment probably because the separating force acting on the porous layer weakens as the first process progresses, as compared to the first embodiment.

Figure 13:
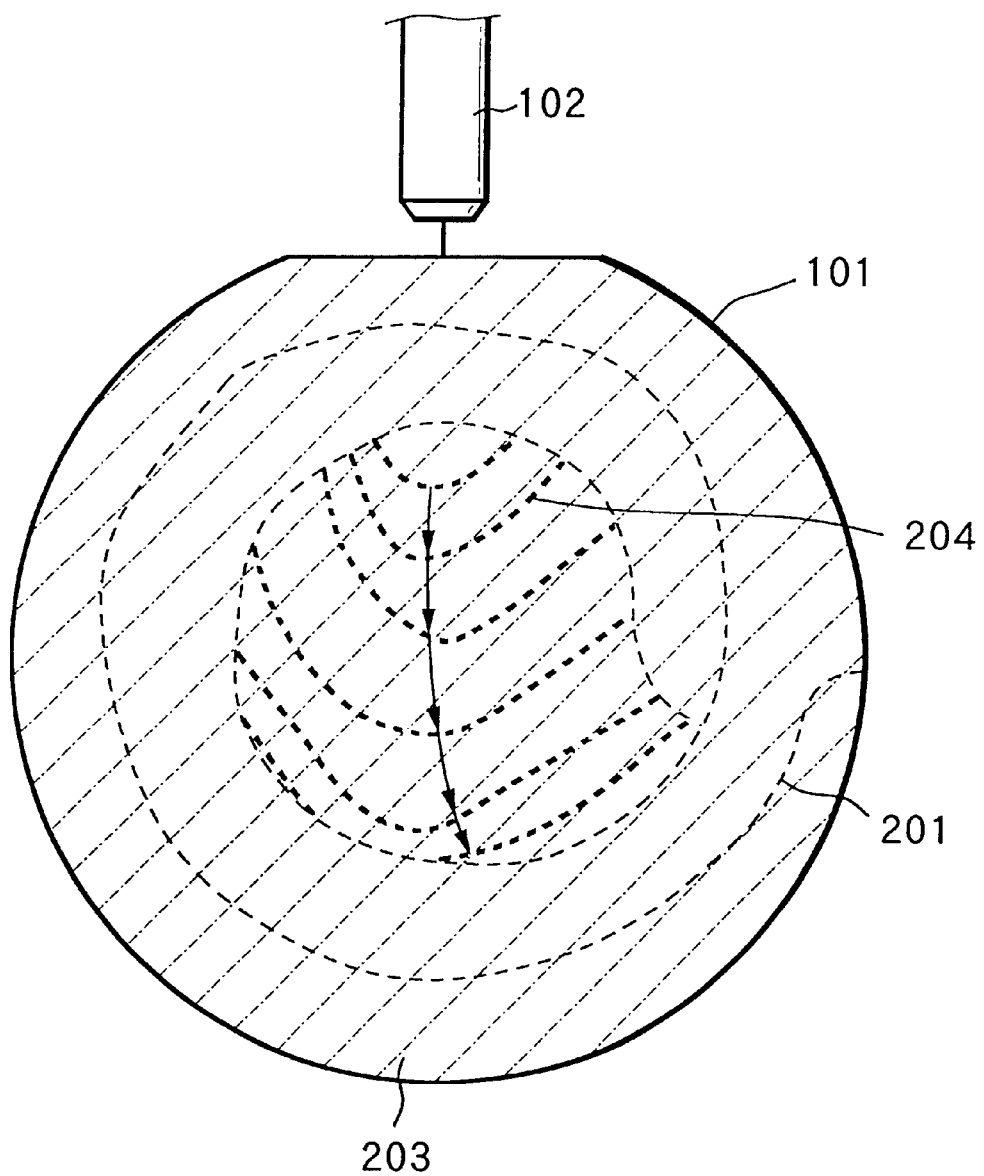
FIG. 13 is a view schematically showing a state wherein a bonded substrate stack is completely separated in the second process according to the fourth embodiment of the first mode.

The second process of this embodiment is the same as in the first embodiment. FIG. 13 is a view schematically showing a state wherein the bonded substrate stack 101 is completely separated in the second process.

Figure 14:
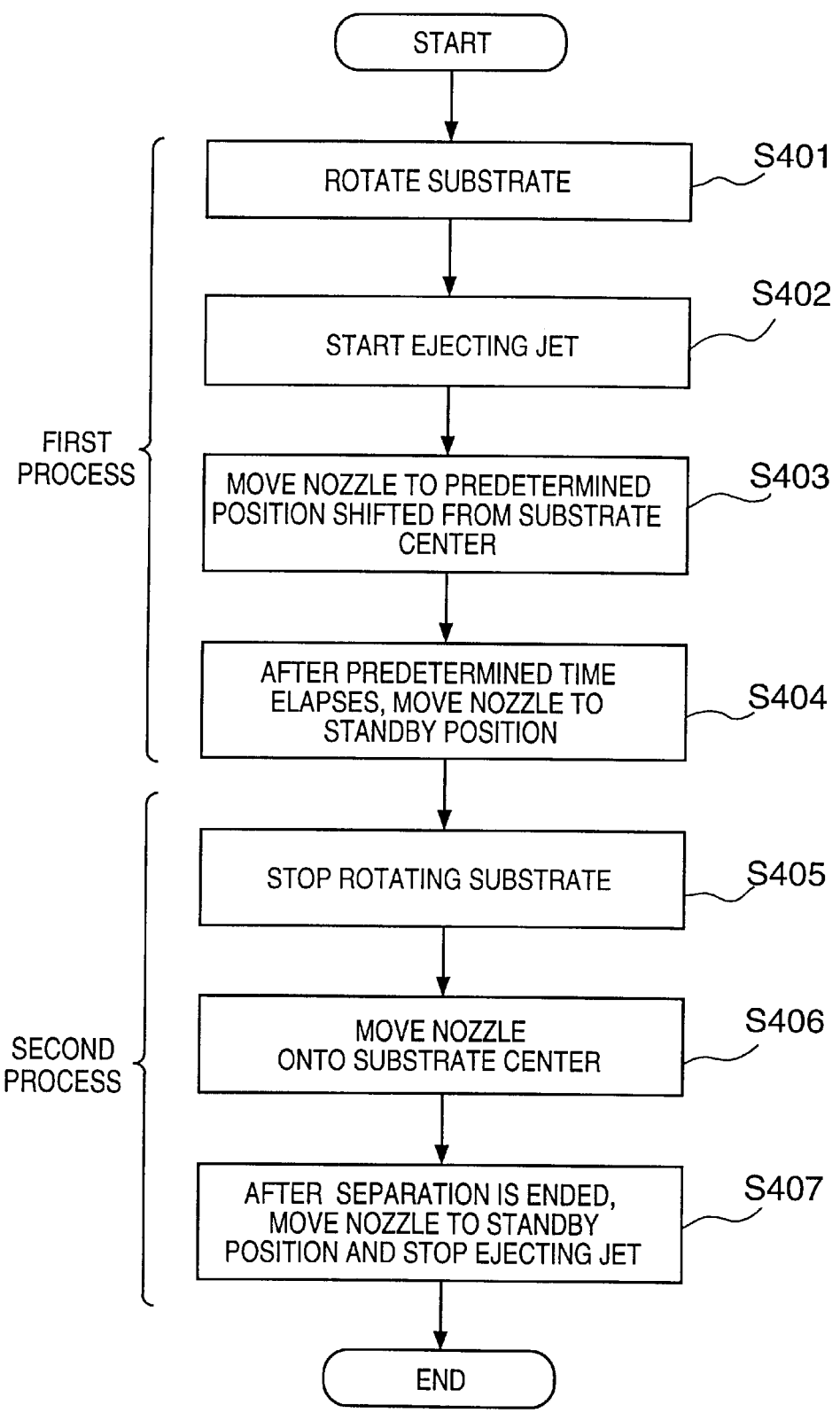
FIG. 14 is a flow chart schematically showing the control procedure of a separating apparatus according to the fourth embodiment of the first mode.

FIG. 14 is a flow chart schematically showing the control procedure of a separating apparatus 100 according to this embodiment. Processing shown in this flow chart is controlled by a controller 190. Processing shown in this flow chart is executed after the bonded substrate stack 101 is set in the separating apparatus 100, i.e., after the bonded substrate stack 101 is held by substrate holding portions 120 and 150.

Steps S401 to S404 correspond to the first process. First, the controller 190 controls a motor 110 to rotate the bonded substrate stack 101 at a predetermined rotational speed (e.g., at 8 rpm) (S401). Next, the controller 190 controls a pump 114 to eject a jet having a predetermined pressure (e.g., 500 kgf/cm²) from a nozzle 102 (S402). Then, the controller 190 controls a nozzle driving section 106 to move the nozzle 102 from the standby position onto a porous layer 101b at a position shifted from the central axis of the bonded substrate stack 101 by a predetermined distance (e.g., 20 to 30 mm) in the horizontal direction (S403). Partial separation of the bonded substrate stack 101 is started. After the region other than the unseparated region 202 to be left is separated (e.g., after a predetermined time elapses), the controller 190 controls the nozzle driving section 106 to move the nozzle 102 to the standby position (S404). The first process is ended.

Steps S405 to S407 correspond to the second process. First, the controller 190 controls the motor 110 to substantially stop rotating the bonded substrate stack 101 (S405). Next, the controller 190 controls the nozzle driving section 106 to move the nozzle 102 from the standby position onto the porous layer 101b on the central axis of the bonded substrate stack 101 (S406). Separation of the unseparated region 202 of the bonded substrate stack 101 is started. After the bonded substrate stack 101 is completely separated (e.g., after a predetermined time elapses), the controller 190 controls the nozzle driving section 106 to move the nozzle 102 to the standby position and controls the pump 114 to stop ejecting the jet (S407). The second process is ended.

In the above first to fourth embodiments, the second process may be started without returning the nozzle 102 to the standby position at the end of the first process.

(Fifth Embodiment)

The fifth embodiment is related to a method of using a wedge instead of a fluid in the second process. As the first process, the first process of one of the first to fourth embodiments is preferable.

Figure 15:
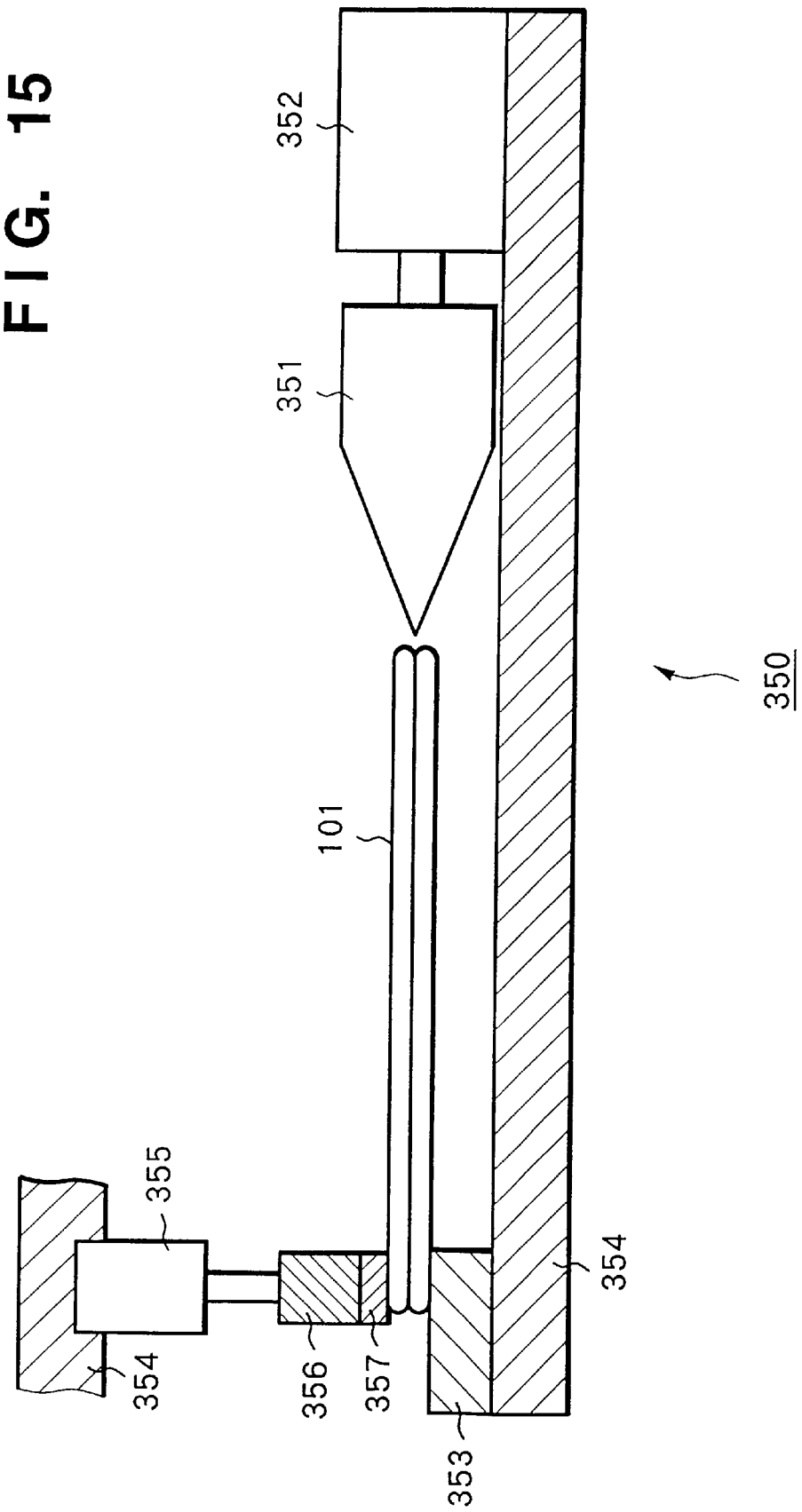
FIG. 15 is a view schematically showing the arrangement of a final separating apparatus according to the fifth embodiment of the first mode.
Figure 16:
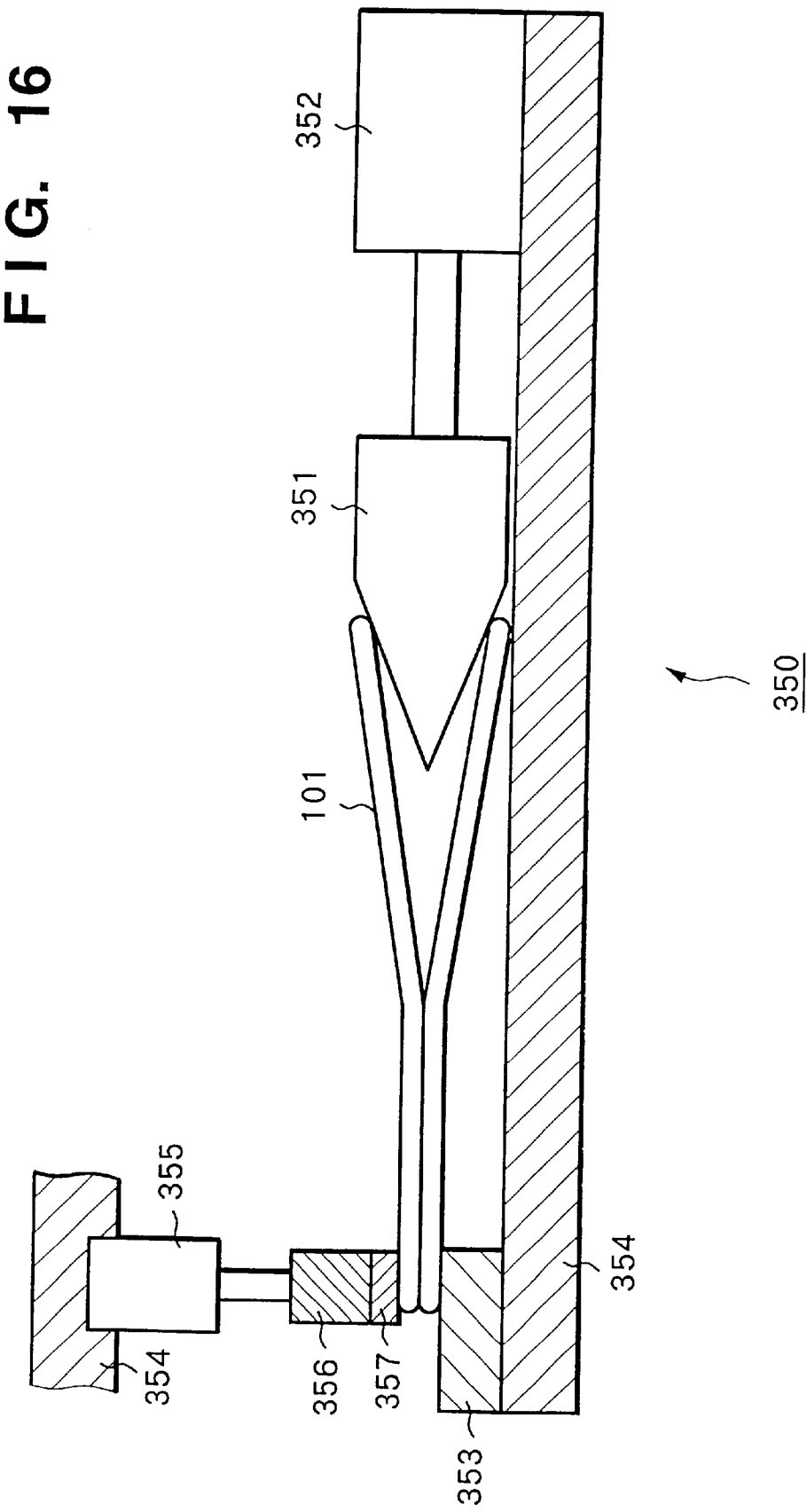
FIG. 16 is a view schematically showing the arrangement of the final separating apparatus according to the fifth embodiment of the first mode.

FIGS. 15 and 16 are views schematically showing the arrangement of a separating apparatus (to be referred to as a final separating apparatus hereinafter) suitable for the second process. A final separating apparatus 350 has first and second support portions 353 and 356 for supporting a predetermined position of a bonded substrate stack 101 after the first process. The support position is preferably, e.g., part of the peripheral portion of the bonded substrate stack.

The first support portion 353 is fixed on a stage 354. The second support portion 356 is fixed at the distal end of the piston of a cylinder 355 fixed on the stage 354. When the bonded substrate stack 101 is to be set in the final separating apparatus 350, the piston is retracted in the cylinder 355 to form a predetermined gap between the first support portion 353 and second support portion 356. After the bonded substrate stack 101 is inserted into the gap, the cylinder 355 is pushed from the cylinder 355, so the bonded substrate stack 101 is pressed by the second support portion 356 from the upper side and held.

An elastic member formed from, e.g., a rubber is preferably arranged at the portion where the first support portion 353 and/or second support portion 356 comes into contact with the bonded substrate stack 101. With this arrangement, separation of the bonded substrate stack 101 is facilitated, and the portion supported by the first support portion 353 and second support portion 356 can be prevented from being applied with excessive stress during separation. In the example shown in FIGS. 15 and 16, an elastic member 357 is attached to the second support portion 356.

The final separating apparatus 350 has a wedge 351 for applying a force to the bonded substrate stack 101 from a predetermined direction. The wedge 351 is reciprocally moved by a cylinder 352. More specifically, to separate the bonded substrate stack 101, the wedge 351 is pushed from the cylinder 352 to insert the distal end of the wedge 351 into the gap in the bonded substrate stack 101, as shown in FIG. 16. With this operation, since the separation region can be gradually widened while applying a strong separating force to part of the unseparated region of the bonded substrate stack 101 and a weak separating force to the remaining portion, defects in separated substrates can be prevented.

Figure 17:
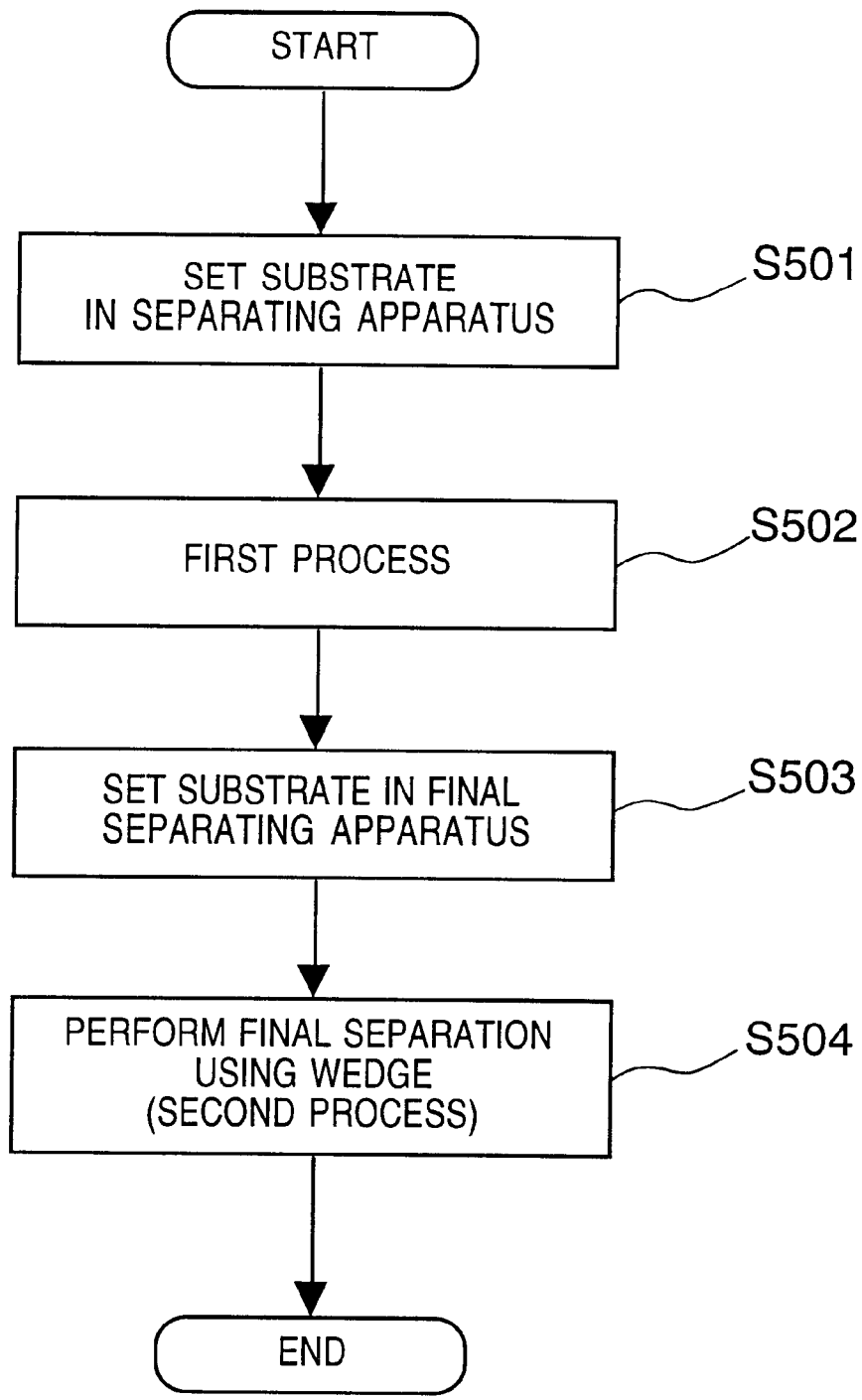
FIG. 17 is a flow chart schematically showing the flow of separation processing using a separating apparatus for the first process and a final separating apparatus for the second process.

FIG. 17 is a flow chart schematically showing the flow of separation processing using a separating apparatus 100 and final separating apparatus 350. First, the bonded substrate stack 101 is set in the separating apparatus 100 (S501). By the same process as the first process of one of the first to fourth embodiments, the bonded substrate stack 101 is partially separated while leaving a predetermined region as an unseparated region (S502). The bonded substrate stack 101 which has undergone the first process is set in the final separating apparatus 350 (S503). The bonded substrate stack 101 is completely separated using the wedge (S504).

Figure 18:
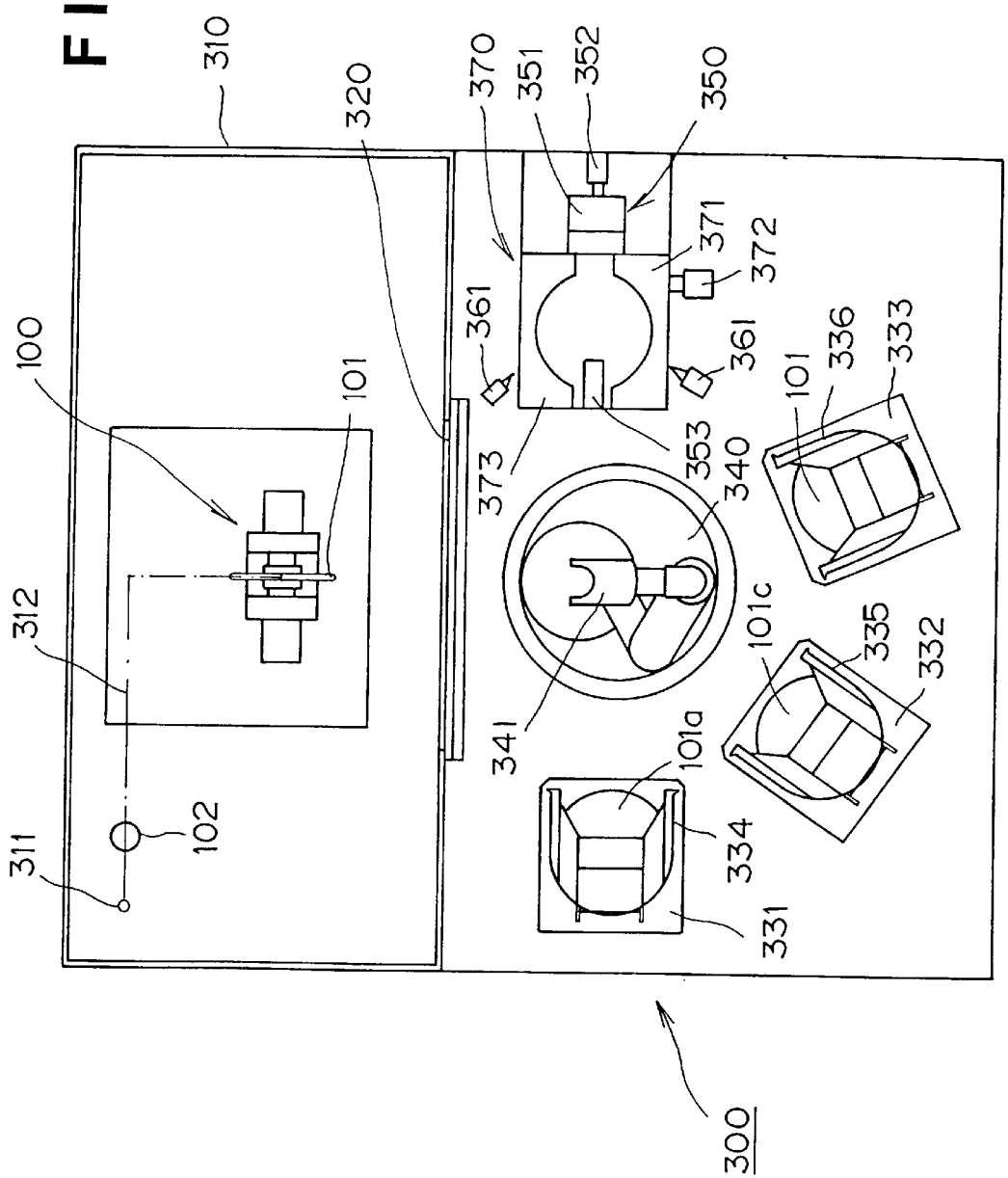
FIG. 18 is a plan view schematically showing an automatic separating apparatus having the separating apparatus for the first process and the final separating apparatus for the second process.

FIG. 18 is a plan view schematically showing an automatic separating apparatus having the separating apparatus 100 and final separating apparatus 350. An automatic separating apparatus 300 comprises the separating apparatus 100 shown in FIG. 2, final separating apparatus 350 shown in FIGS. 15 and 16, substrate conveyor robot 340, loader 333, first unloader 332, second unloader 331, centering unit 370, and an air blow unit 361.

The separating apparatus 100 is arranged in a chamber 310 to prevent scattering of a jet medium (e.g., water). The chamber 310 has a shutter 320 at a window portion to load/unload the bonded substrate stack 101 before and after the first process.

Before separation processing, a carrier 336 which stores unprocessed bonded substrate stacks 101 is placed on the loader 333, and empty carriers 335 and 334 for storing separated substrates are placed on the first and second unloaders 332 and 331, respectively.

In the centering unit 370, a guide member 371 having an arcuated surface conforming to the bonded substrate stack 101 is pushed by a cylinder 372 to sandwich the bonded substrate stack 101 between the guide member 371 and another guide member 373, thereby centering the bonded substrate stack 101. The centering unit 370 and final separating apparatus 350 are integrated. For this reason, after the bonded substrate stack 101 processed in the first process is centered, final separation can be done using the wedge 351 while keeping part of the bonded substrate stack 101 held. In FIG. 18, the second support portion 356 and the like shown in FIGS. 15 and 16 are not illustrated.

The substrate conveyor robot 340 conveys the bonded substrate stack 101 or each separated substrate by holding it with a robot hand 341. The robot hand 341 has a function of vertically setting or turning over a held substrate.

Figure 19:
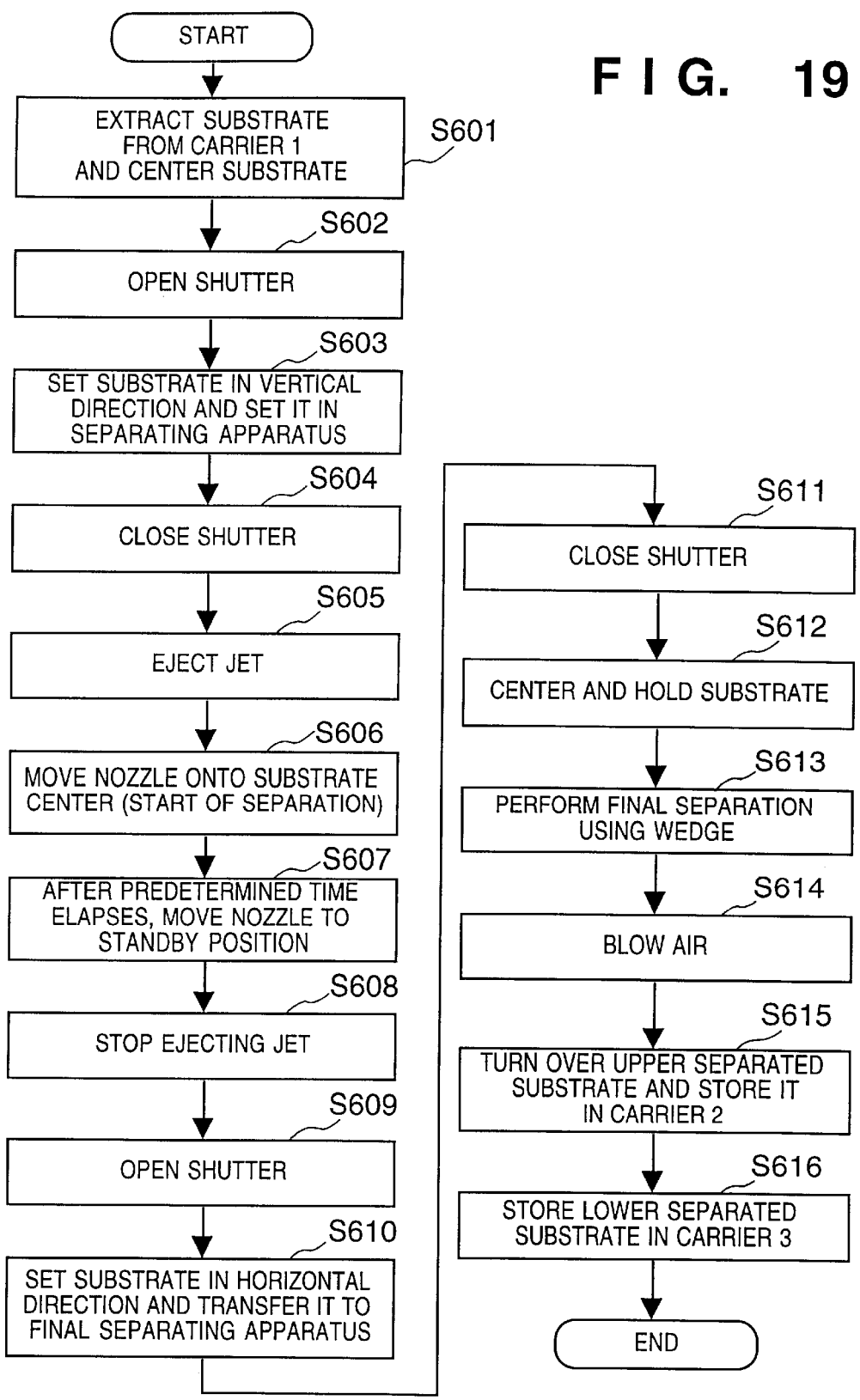
FIG. 19 is a flow chart schematically showing separation processing by the automatic separating apparatus.

FIG. 19 is a flow chart schematically showing separation processing by the automatic separating apparatus 300. Processing shown in this flow chart is controlled by a controller (not shown). This processing is executed after the carrier 336 which stores unprocessed bonded substrate stacks 101 is placed on the loader 333, and the empty carriers 335 and 334 for storing separated substrates are placed on the first and second unloaders 332 and 331, respectively.

First, the bonded substrate stack 101 is extracted from the carrier 336 on the loader 333 by the conveyor robot 340 and centered by the centering unit 370 (S601). The shutter 320 is opened (S602). The surfaces of the centered bonded substrate stack 101 are made set in the vertical direction by rotating the robot hand 341 through 90°, and the bonded substrate stack 101 is set in the separating apparatus 100 (S603).

The shutter 320 is closed (S604). Jet ejection is started (S605). A nozzle 102 is moved from a stand by position 311 onto the center of the bonded substrate stack 101 along a moving path 312, and separation processing of the first process is started (S606). As separation processing of the first process, the first process of one of the first to fourth embodiments is suitable.

When a predetermined time has elapsed, and separation processing is ended while leaving a predetermined region as an unseparated region, the nozzle 102 is returned to the standby position 311 along the moving path 312 (S607), and jet ejection is stopped (S608).

The shutter 320 is opened (S609). The robot hand 341 receives the bonded substrate stack 101 from the separating apparatus 100. The bonded substrate stack 101 is set in the vertical direction by rotating the robot hand 341 through 90° and transferred to the final separating apparatus 350 (centering unit 370) (S610). The shutter 320 is closed (S611).

The bonded substrate stack 101 is centered by the centering unit 370 and held by the first and second support members 353 and 356 (FIGS. 15 and 16) (S612). The bonded substrate stack is completely separated by inserting the wedge 351 into the gap in the bonded substrate stack 101 (S613). Dust generated from the final separating apparatus 350 and centering unit 370 in separation is removed by the air blow unit 361 (S614).

An upper substrate 101c separated is turned over by the robot hand 341 (rotated through 180°) and stored in the carrier 335 on the unloader 332 (S615). A lower substrate 101a separated is stored in the carrier 334 on the unloader 331 by the robot hand 341 (S616).

With the above process, separation of one bonded substrate stack 101 is ended. When unprocessed bonded substrate stacks 101 remain, the above process is repeated.

According to the first mode of the present invention, for example, an apparatus and method suitable for preventing defects in separating a sample such as a substrate having a separation layer can be provided.

[Second Mode]

An improved separating apparatus and separation processing for solving the above problems will be described below as the second mode of the present invention.

The present inventor has found on the basis of experiments that the above defects can be reduced by the following method.

The first region of a porous layer 101b is separated mainly using a jet, and the second region of the bonded substrate stack 101 is separated mainly by applying a vibration energy, thereby completely separating a bonded substrate stack 101. The first region is preferably substantially a region (peripheral region) outside the region where substrate holding portions 120 and 150 press the bonded substrate stack 101. The second region preferably substantially includes the region where the substrate holding portions 120 and 150 press the bonded substrate stack 101, i.e., a region where the porous layer 101b may be peeled off at once by basic separation processing by a separating apparatus 100.

As described above, when the first region of the bonded substrate stack 110 is separated mainly using a jet, the efficiency of separation processing can be increased. When the second region of the bonded substrate stack 101 is separated mainly using a vibration energy, the above defects can be prevented. More specifically, when the second region is separated mainly using a vibration energy, the second region can be gradually separated, and the above defects can be prevented. On the other hand, when a bonded substrate stack is completely separated using only a jet having a predetermined pressure from the start to the end of separation while rotating the bonded substrate stack at a predetermined speed, as in basic separation processing by the separating apparatus 100, the separating force abruptly increases at the final stage. Since a small unseparated region is peeled off at once, defects may be generated.

The first and second regions may be simultaneously separated. The first region maybe separated first, and then, the second region may be separated. Conversely, the second region may be separated first, and then, the first region may be separated. Separation processing of the first and second regions may be executed by one apparatus or different apparatuses.

Embodiments of the improved separating apparatus and separation processing according to the second mode of the present invention will be described below.

(First Embodiment)

Figure 21:
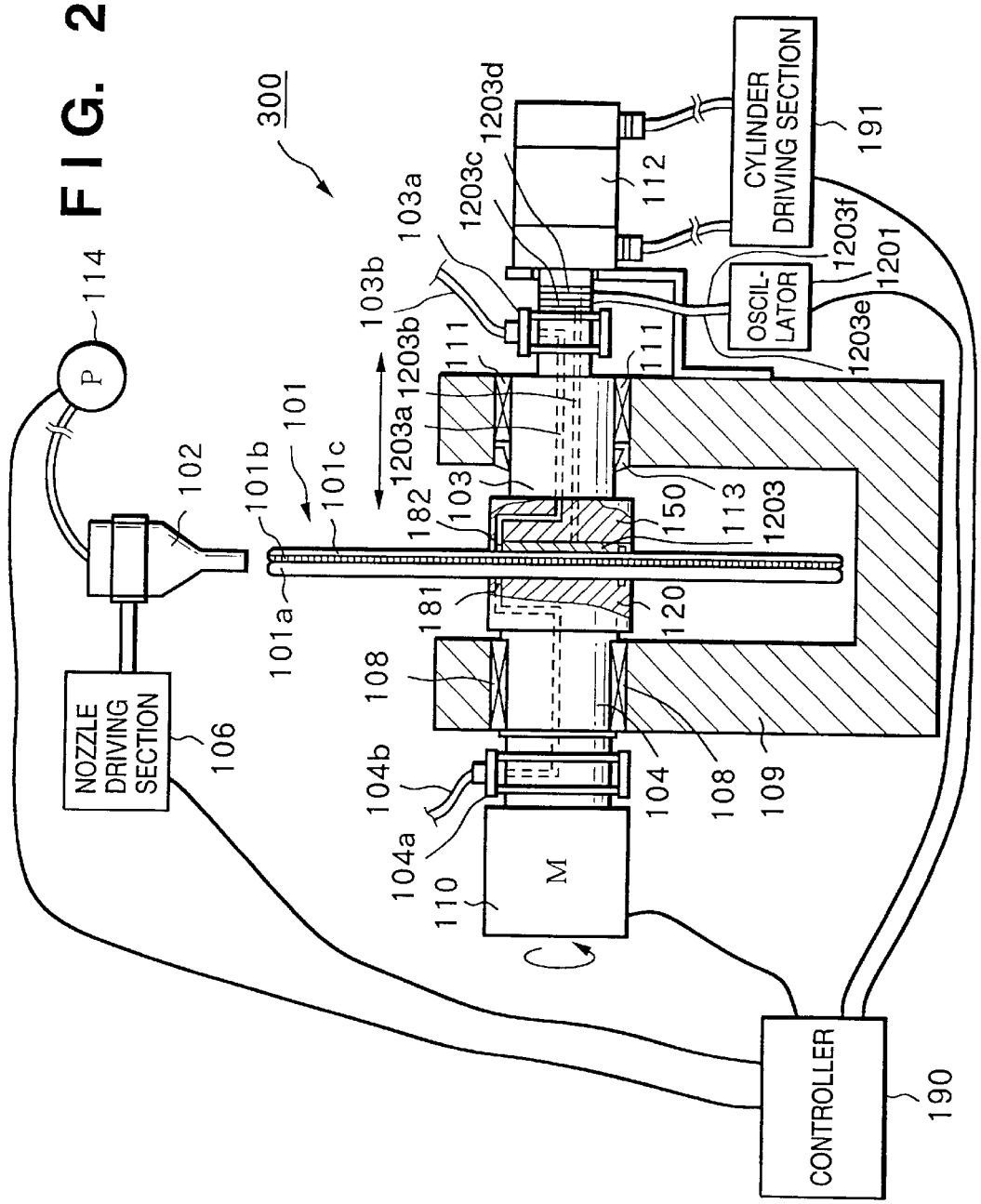
FIG. 21 is a view schematically showing the arrangement of an improved separating apparatus according to the first to third embodiments of the second mode of the present invention.

FIG. 21 is a view schematically showing the arrangement of an improved separating apparatus according to the first embodiment of the second mode of the present invention. The same reference numerals as in the separating apparatus 100 shown in FIG. 2 denote the same parts in FIG. 21, and a detailed description thereof will be omitted.

A separating apparatus 300 of this embodiment has an ultrasonic vibrator 1203 in the substrate holding portion 150. The ultrasonic vibrator 1203 is driven in accordance with an output signal from an oscillator 1201. An output signal from the oscillator 1201 is supplied to the ultrasonic vibrator 1203 through signal lines 1203e and 1203f with brushes at the distal ends, rings 1203c and 1203d electrically connected to the brushes, and signal lines 1203a and 1203b running through a rotary shaft 103. ON/OFF of the oscillator 1201 and output signal amplitude and frequency are controlled by a controller 190.

Figure 23:
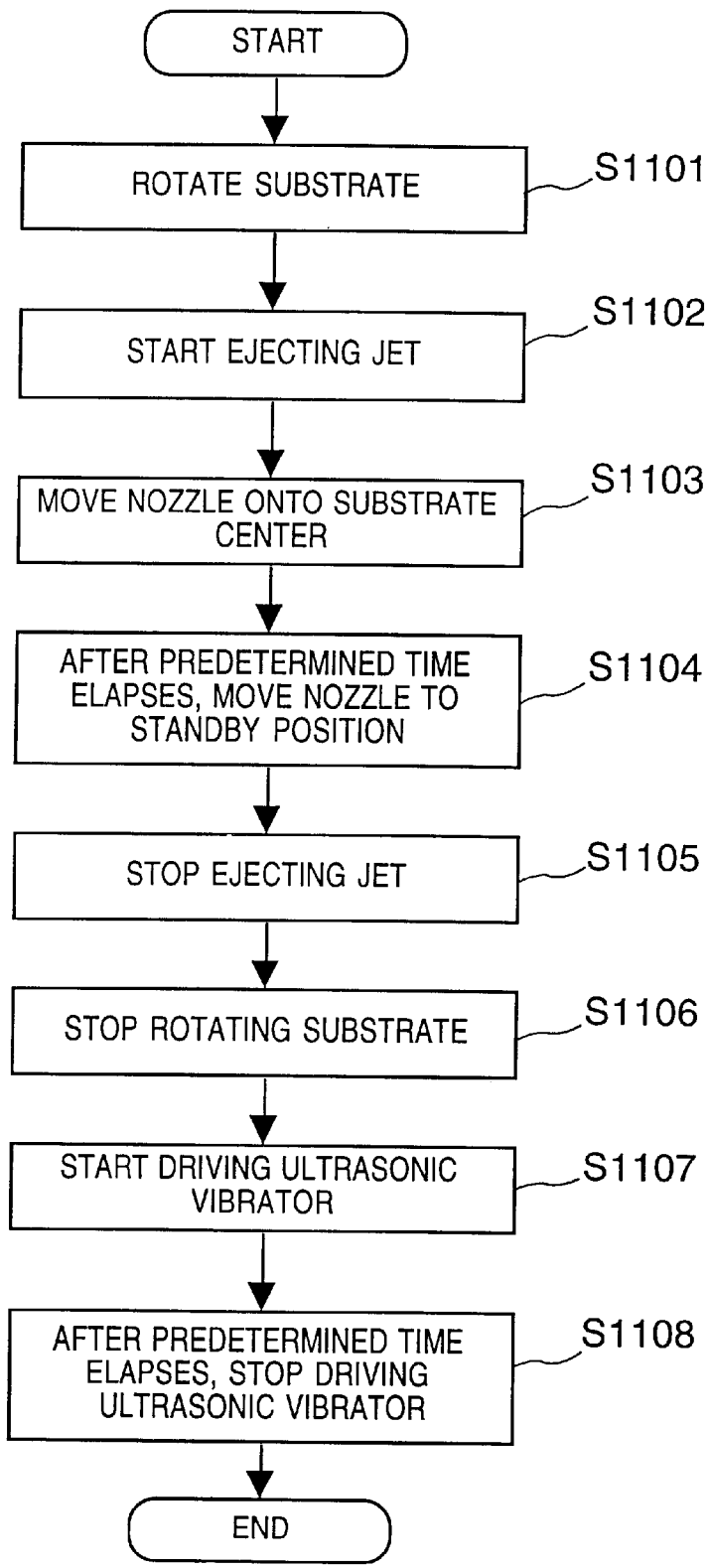
FIG. 23 is a flow chart schematically showing the procedure of separation processing according to the first embodiment of the second mode using the separating apparatus shown in FIG. 21.

FIG. 23 is a flow chart schematically showing the procedure of separation processing according to the first embodiment using the separating apparatus 300. Processing shown in this flow chart is controlled by the controller 190. Processing shown in this flow chart is executed after the bonded substrate stack 101 is set in the separating apparatus 300.

In separation processing according to the first embodiment, first, the first region of the bonded substrate stack 101 is separated by a jet while rotating the bonded substrate stack 101, and then, the second region of the bonded substrate stack 101 is separated by an ultrasonic wave, thereby completely separating the bonded substrate stack 101. The first region is substantially a region outside the region pressed by the substrate holding portions 120 and 150. The second region is substantially the region pressed by the substrate holding portions 120 and 150.

Steps S1101 to S1106 correspond to first region separation processing. The controller 190 controls a motor 110 to rotate the bonded substrate stack 101 at a predetermined rotational speed (S1101). The rotational speed may be constant or change over time. Preferably, the rotational speed is set to be relatively low (e.g., 4 to 12 rpm) for the first revolution and then set to be relatively high (e.g., 25 to 35 rpm).

Next, the controller 190 controls a pump 114 to eject a jet having a predetermined pressure (e.g., 500 kgf/cm$^2$) from a nozzle 102 (S1102).

The controller 190 controls a nozzle driving section 106 to move the nozzle 102 from the standby position onto a porous layer 101b on the central axis of the bonded substrate stack 101 (S1103). Separation of the first region of the bonded substrate stack 101 is started.

After the first region is separated (e.g., after a predetermined time elapses), the controller 190 controls the nozzle driving section 106 to move the nozzle 102 to the standby position (S1104) and controls the pump 114 to stop ejecting the jet (S1105). The controller 190 controls the motor 110 to stop rotating the bonded substrate stack 101 (S1106).

Figure 22:
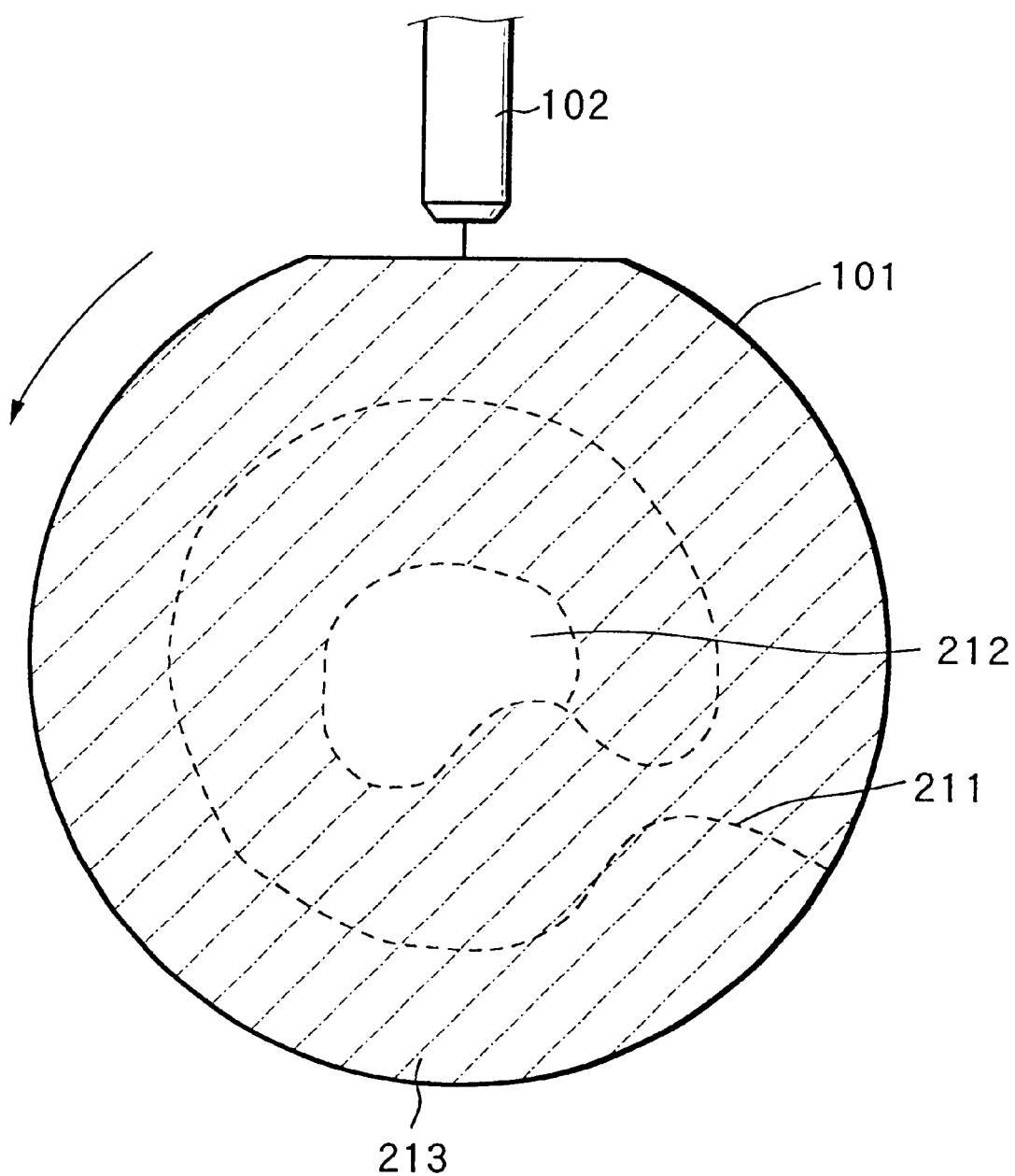
FIG. 22 is a view schematically showing a bonded substrate stack after the first region (e.g., the peripheral portion) is separated by a jet in the first embodiment of the second mode.

FIG. 22 is a view schematically showing the bonded substrate stack 101 after the first region is separated by a jet. Referring to FIG. 22, reference numeral 211 denotes a boundary between an already separated (separation region) and region which has not been separated yet (unseparated region) during separation processing using a jet. In this embodiment, since the first region is separated by a jet while rotating the bonded substrate stack 101, the locus of the boundary 211 has a spiral shape. A hatched region 213 is the first region, and a region 212 without hatching is the second region.

Steps S1107 and S1108 correspond to second region separation processing. First, the controller 190 controls the oscillator 1201 to start driving the ultrasonic vibrator 1203 (S1107). The ultrasonic vibrator 1203 generates an ultrasonic wave (vibration energy), and separation of the second region using this ultrasonic wave is started. After the second region is separated (e.g., after a predetermined time elapses), the controller 190 controls the oscillator 1201 to stop operation of the ultrasonic vibrator 1203 (S1108). Separation processing of the bonded substrate stack 101 is ended. The bonded substrate stack 101 may be rotated during second region separation using the ultrasonic wave.

According to this embodiment, the second region remaining after separation of the first region is separated using an ultrasonic wave. With this arrangement, a small unseparated region can be prevented from being peeled off at once, and defects by separation processing can be prevented.

In addition, according to this embodiment, an ultrasonic wave is applied while the jet medium is present in the bonded substrate stack 101. During separation of the second region, the jet medium functions as a medium for breaking the porous layer 101b, and this is probably why separation processing efficiently progresses.

In this embodiment, the first and second regions are separated by one separating apparatus 300. Instead, the first and second regions may be separated using different separating apparatuses.

(Second Embodiment)

The second embodiment uses a separating apparatus 300 according to the first embodiment shown in FIG. 21 and is different from the first embodiment in the procedure of separation processing.

Figure 24:
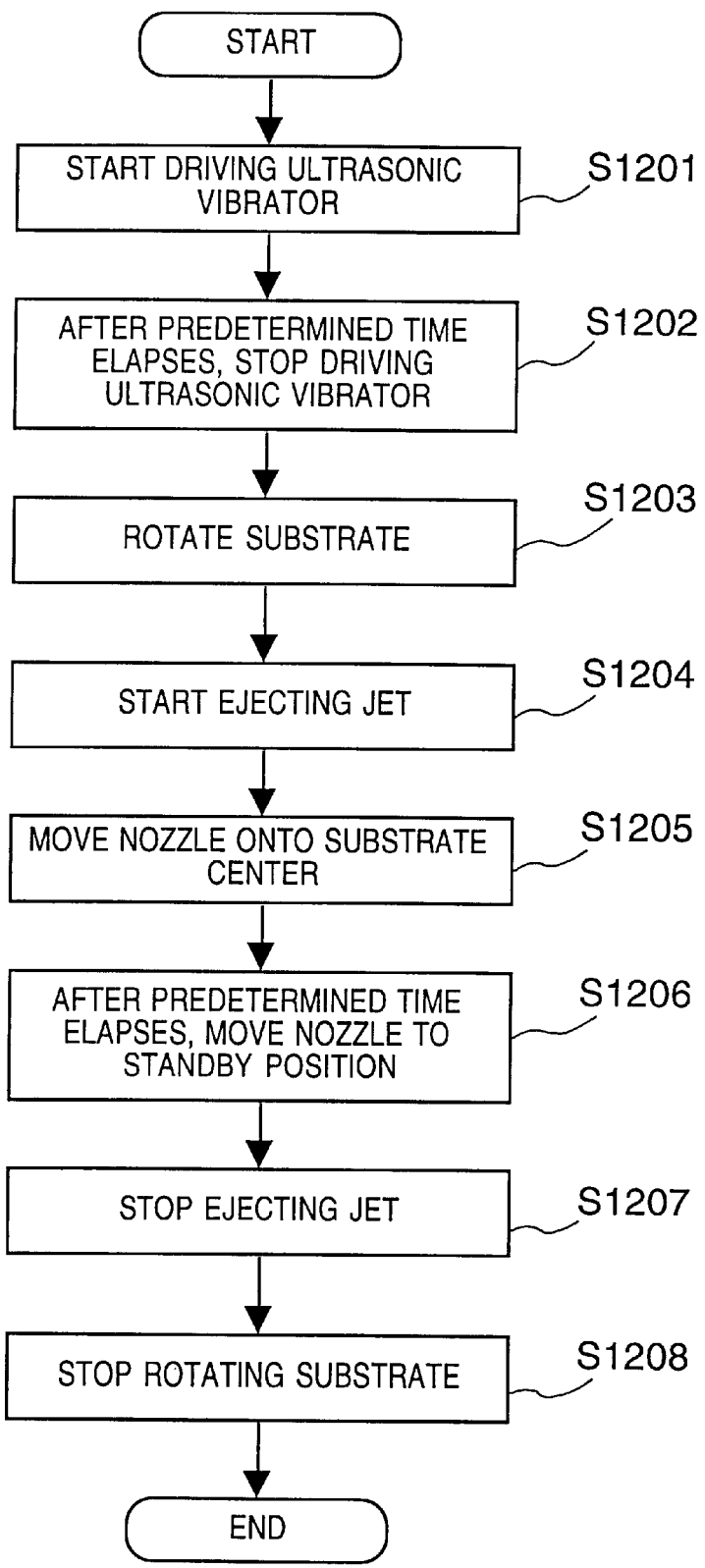
FIG. 24 is a flow chart schematically showing the procedure of separation processing according to the second embodiment of the second mode using the separating apparatus shown in FIG. 21.

FIG. 24 is a flow chart schematically showing the procedure of separation processing according to the second embodiment using the separating apparatus 300. Processing shown in this flow chart is controlled by a controller 190. Processing shown in this flow chart is executed after a bonded substrate stack 101 is set in the separating apparatus 300.

In separation processing according to the second embodiment, first, the second region of the bonded substrate stack 101 is separated using an ultra sonic wave. After this, the first region of the bonded substrate stack 101 is separated by a jet while rotating the bonded substrate stack 101, thereby completely separating the bonded substrate stack 101.

Steps S1201 and S1202 correspond to second region separation processing. First, the controller 190 controls an oscillator 1201 to start driving an ultrasonic vibrator 1203 (S1201). The ultrasonic vibrator 1203 generates an ultrasonic wave, and separation of the second region using this ultrasonic wave is started. After the second region is separated (e.g., after a predetermined time elapses), the controller 190 controls the oscillator 1201 to stop operation of the ultrasonic vibrator 1203 (S1202).

Steps S1203 to S1208 correspond to first region separation processing. First, the controller 190 controls a motor 110 to rotate the bonded substrate stack 101 at a predetermined rotational speed (S1203). Rotation of the bonded substrate stack 101 may be started before the start of separation of the second region or during separation of the second region.

Next, the controller 190 controls a pump 114 to eject a jet having a predetermined pressure (e.g., 500 kgf/cm$^2$) from a nozzle 102 (S1204).

The controller 190 controls a nozzle driving section 106 to move the nozzle 102 from the standby position onto a porous layer 101b on the central axis of the bonded substrate stack 101 (S1205). Separation of the first region of the bonded substrate stack 101 is started.

After the first region is separated (e.g., after a predetermined time elapses), the controller 190 controls the nozzle driving section 106 to move the nozzle 102 to the standby position (S1206) and controls the pump 114 to stop ejecting the jet (S1207). The controller 190 controls the motor 110 to stop rotating the bonded substrate stack 101 (S1208).

According to the second embodiment, the second region (central portion) is separated by an ultrasonic wave first, and the porous layer 101b at the peripheral portion (to be referred to as a ring-shaped region) adjacent to the second region, which is fragile from the start, becomes more fragile. In this embodiment, the ring-shaped region is separated at the final stage of separation processing of the first region. For this reason, when the ring-shaped region becomes fragile, the ring-shaped region can be easily separated by a jet and can be prevented from being peeled off at once. Hence, any defects that may be generated in separation processing by the above-described basic separating apparatus can be reduced.

In this embodiment, the first and second regions are separated by one separating apparatus 300. However, the first and second regions may be separated by different separating apparatuses.

(Third Embodiment)

The third embodiment uses a separating apparatus 300 according to the first embodiment shown in FIG. 21 and is different from the first embodiment in the procedure of separation processing.

Figure 25:
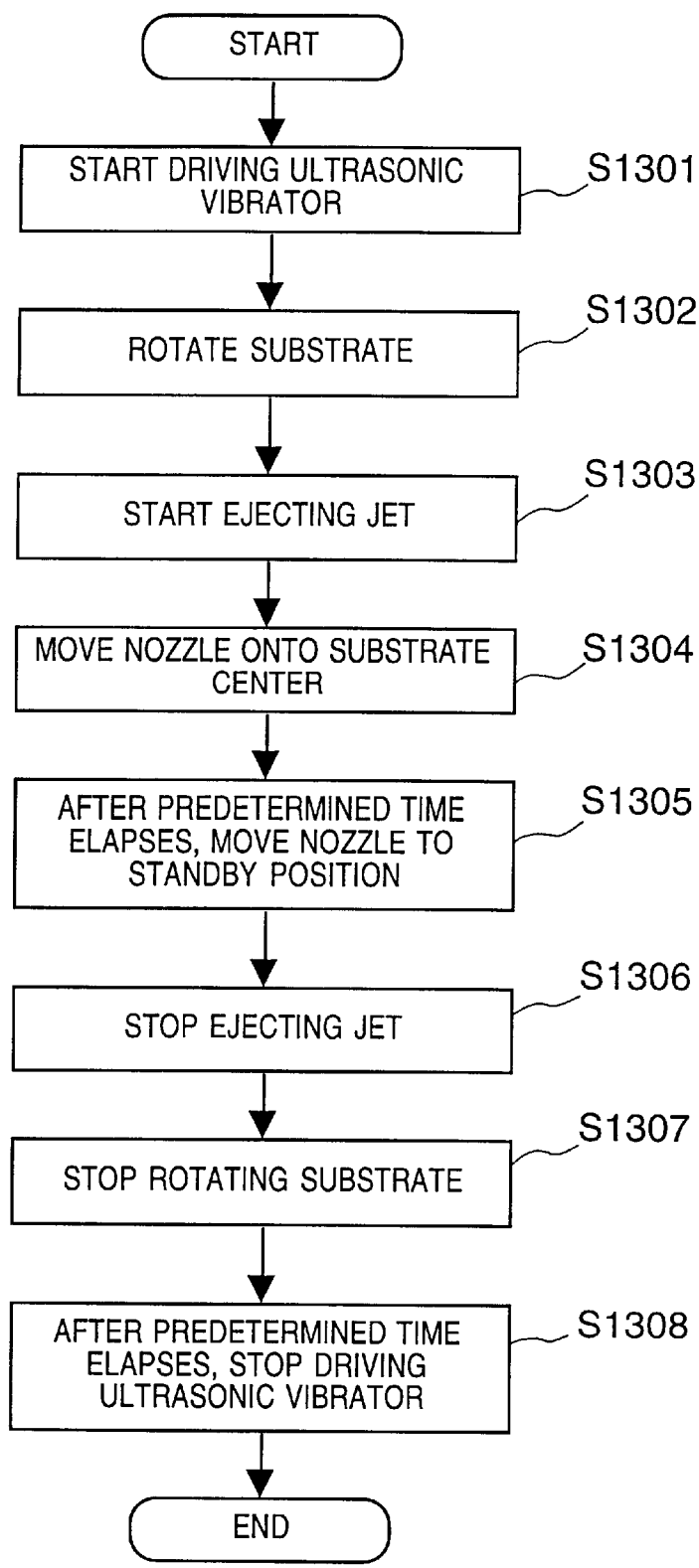
FIG. 25 is a flow chart schematically showing the procedure of separation processing according to the third embodiment of the second mode using the separating apparatus shown in FIG. 21.

FIG. 25 is a flow chart schematically showing the procedure of separation processing according to the third embodiment using the separating apparatus 300. Processing shown in this flow chart is controlled by a controller 190. Processing shown in this flow chart is executed after a bonded substrate stack 101 is set in the separating apparatus 300.

In the third embodiment, first region separation processing using a jet and second region separation processing using an ultrasonic wave are parallelly executed. With this arrangement, the time required to completely separate a bonded substrate stack can be shortened, and the throughput can be improved.

First, the controller 190 controls an oscillator 1201 to start driving an ultrasonic vibrator 1203 (S1301). The ultrasonic vibrator 1203 generates an ultrasonic wave, and separation of the second region by this ultrasonic wave is started.

Next, the controller 190 controls a motor 110 to rotate the bonded substrate stack 101 at a predetermined rotational speed (S1302). The controller 190 controls a pump 114 to eject a jet having a predetermined pressure (e.g., 500 kgf/cm$^2$) from a nozzle 102 (S1303).

The controller 190 controls a nozzle driving section 106 to move the nozzle 102 from the standby position onto a porous layer 101b on the central axis of the bonded substrate stack 101 (S1304). Separation of the first region of the bonded substrate stack 101 is started.

After the first region is separated (e.g., after a predetermined time elapses), the controller 190 controls the nozzle driving section 106 to move the nozzle 102 to the standby position (S1305) and controls the pump 114 to stop ejecting the jet (S1306). The controller 190 controls the motor 110 to stop rotating the bonded substrate stack 101 (S1307).

After the second region is separated (e.g., after a predetermined time elapses), the controller 190 controls the oscillator 1201 to stop operation of the ultrasonic vibrator 1203 (S1308).

According to this embodiment, since first region separation processing by a jet and second region separation processing by an ultrasonic wave are parallelly executed, the time required to completely separate the bonded substrate stack 101 can be shortened, and the throughput can be improved.

In addition, according to this embodiment, the jet medium injected into the bonded substrate stack 101 functions as a medium for transmitting an ultrasonic wave, and separation processing efficiently progresses.

The order of the above steps can be changed as needed in consideration of the relationship between the time required for first region separation processing and that required for second region separation processing.

As described above, according to the third embodiment, defects in separation processing can be prevented by separating the second region mainly using an ultrasonic wave.

(Fourth Embodiment)

In the fourth embodiment, the first region is separated by a separating apparatus (first separating apparatus) 100 shown in FIG. 2, and the second region is separated by a separating apparatus (second separating apparatus) having an ultrasonic tank. A separating apparatus 300 shown in FIG. 21 may be used in place of the separating apparatus 100.

Figure 26:
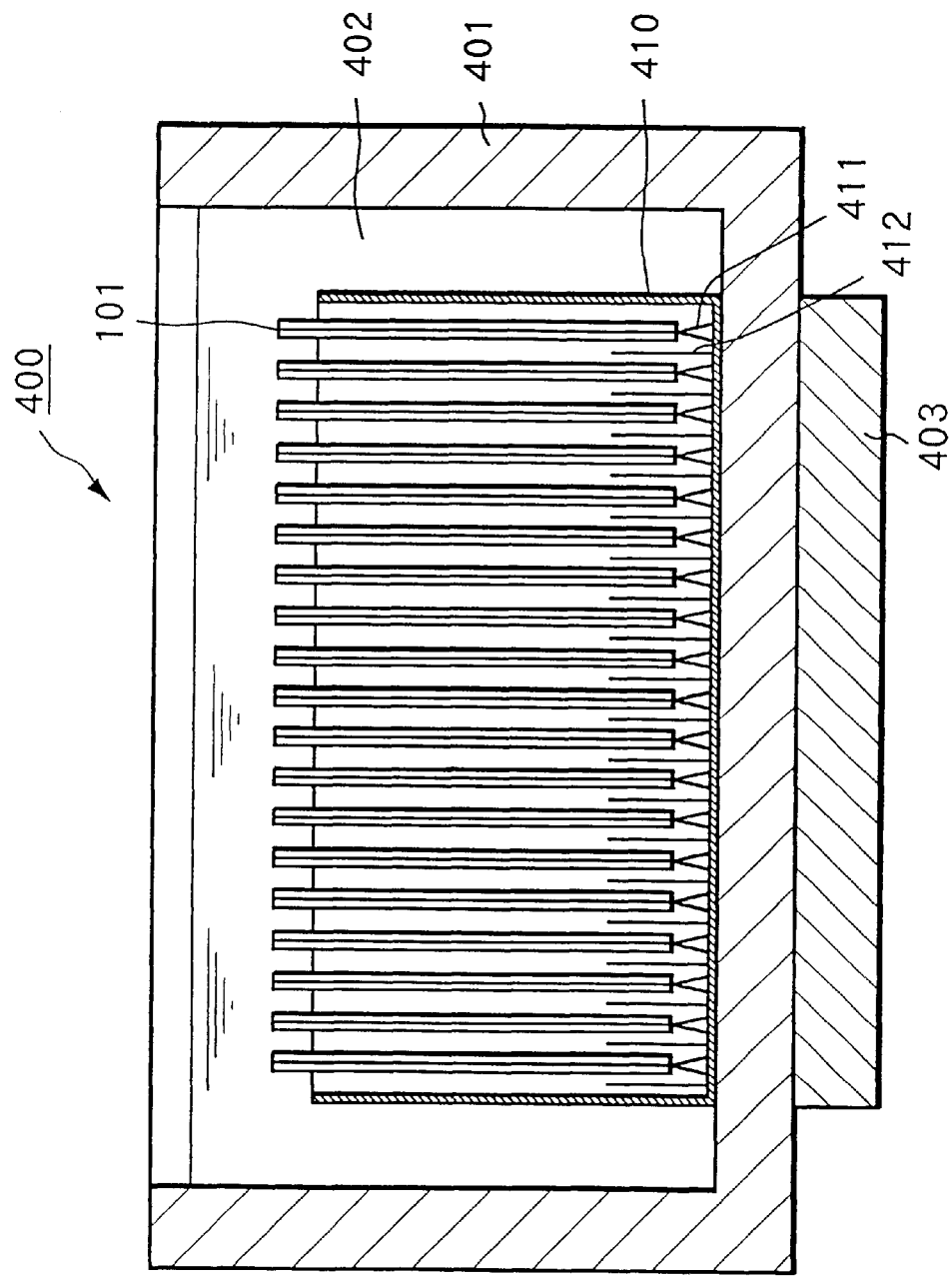
FIG. 26 is a sectional view schematically showing the arrangement of a second separating apparatus applied to the fourth embodiment of the second mode of the present invention.

FIG. 26 is a sectional view schematically showing the arrangement of the second separating apparatus. A second separating apparatus 400 has an ultrasonic tank 401 and ultrasonic source 403. When the second region is to be separated, the ultrasonic tank 401 is filled with a liquid (e.g., pure water) 402 as an ultrasonic transmission medium. A cassette 410 which stores one or a plurality of bonded substrate stacks 101 whose first regions are separated is dipped in the ultrasonic tank 401. In this state, when an ultrasonic wave (vibration energy) is transmitted from the ultrasonic source 403 to the bonded substrate stack 101 through the ultrasonic tank 401 and liquid 402, the second region of the bonded substrate stack 101 can be separated.

The cassette 410 has a plurality of support plates 412 for supporting a plurality of bonded substrate stacks 101, and a plurality of partitions 411 for partitioning two substrates obtained by separating the bonded substrate stack 101 into two substrates. The partitions 411 are arranged on the bottom portion of the ultrasonic tank 401 and have a wedge shape with a sharp upper portion (distal end portion) which widens toward the lower side. To set the bonded substrate stacks 101 in the cassette 410, the groove in the side surface of each bonded substrate stack 101 (i.e. the portion at which two substrates are bonded to form the bonded substrate stack 101) is engaged with the distal end portion of a partition 411.

Figure 27:
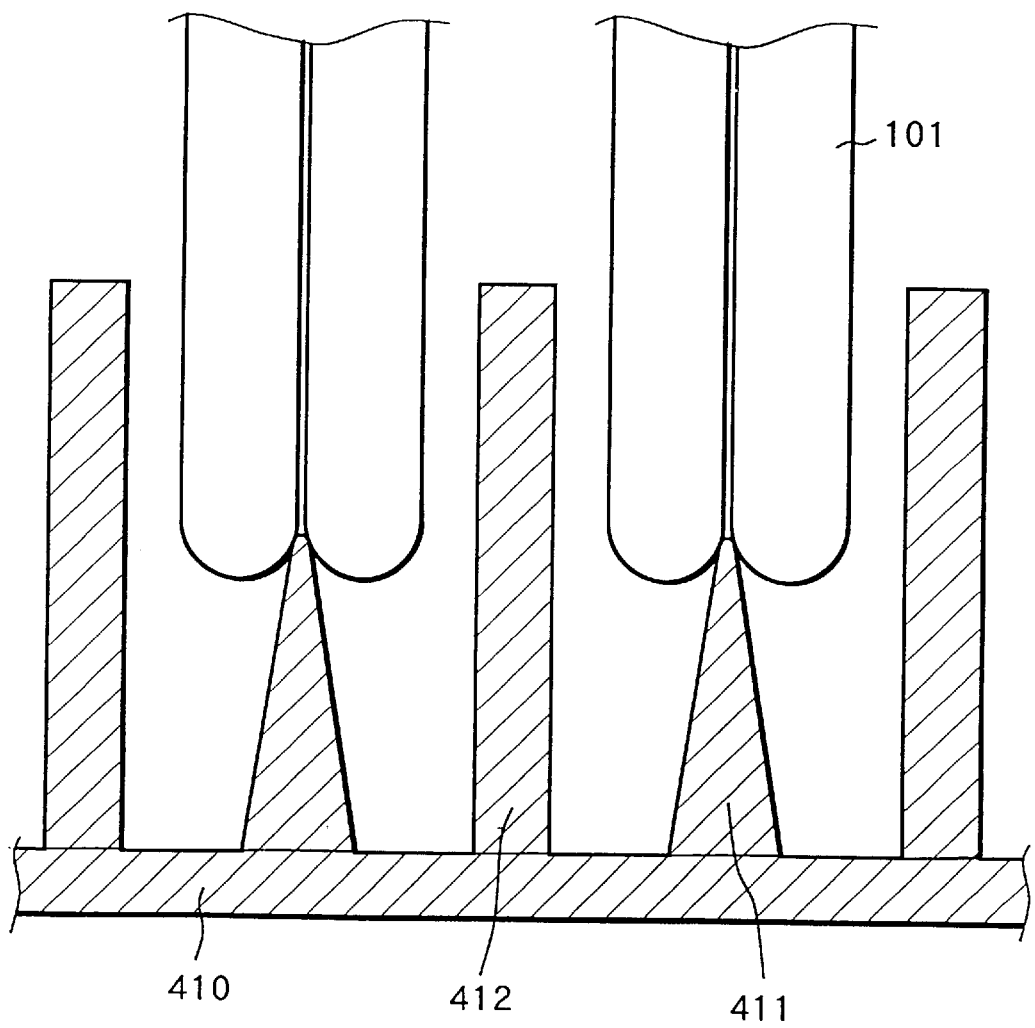
FIG. 27 is an enlarged view showing part of a cassette shown in FIG. 26 (before separation of second region)
Figure 28:
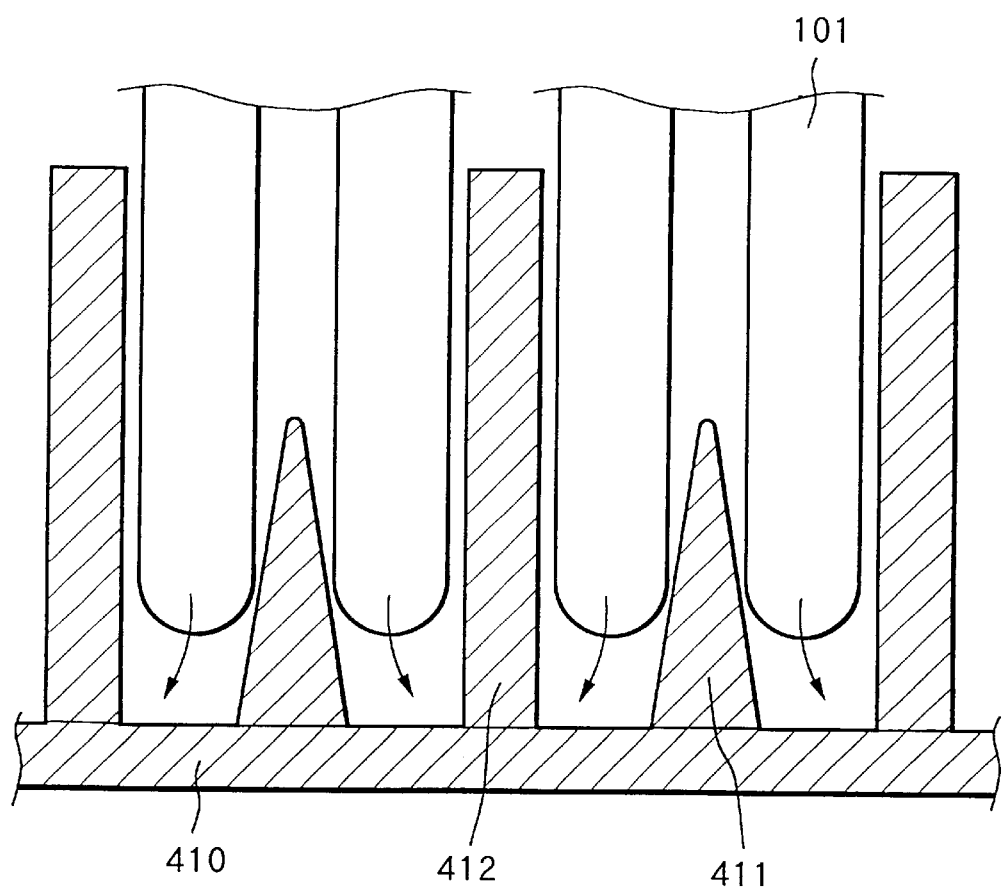
FIG. 28 is an enlarged view showing part of the cassette shown in FIG. 26 (after separation of second region)

FIGS. 27 and 28 are enlarged views showing part of the cassette 410 shown in FIG. 26. FIG. 27 shows a state before the second region of the bonded substrate stack 101 is separated. FIG. 28 shows a state after the second region of the bonded substrate stack 101 is separated.

When the second region of the bonded substrate stack 101 is separated by an ultrasonic wave supplied through the ultrasonic transmission medium 402, the bonded substrate stack 101 is completely separated. As shown in FIG. 28, separated substrates drop by their own weight along the side walls of the partitions 411 and are separated from each other.

Figure 29:
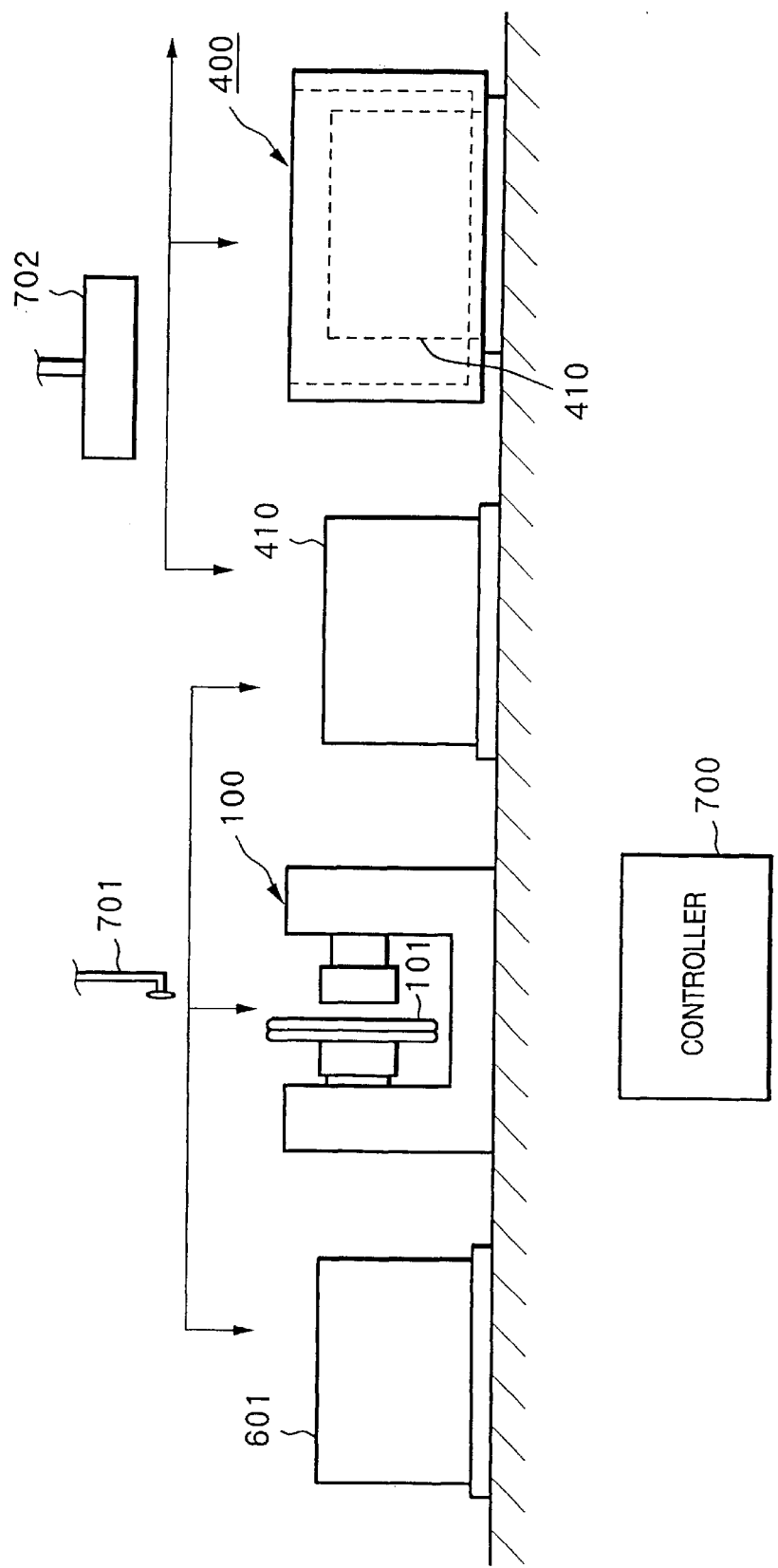
FIG. 29 is a view schematically showing the arrangement of a processing system according to the fourth embodiment of the second mode, which executes a series of processes of separating a bonded substrate stack into two substrates.
Figure 30:
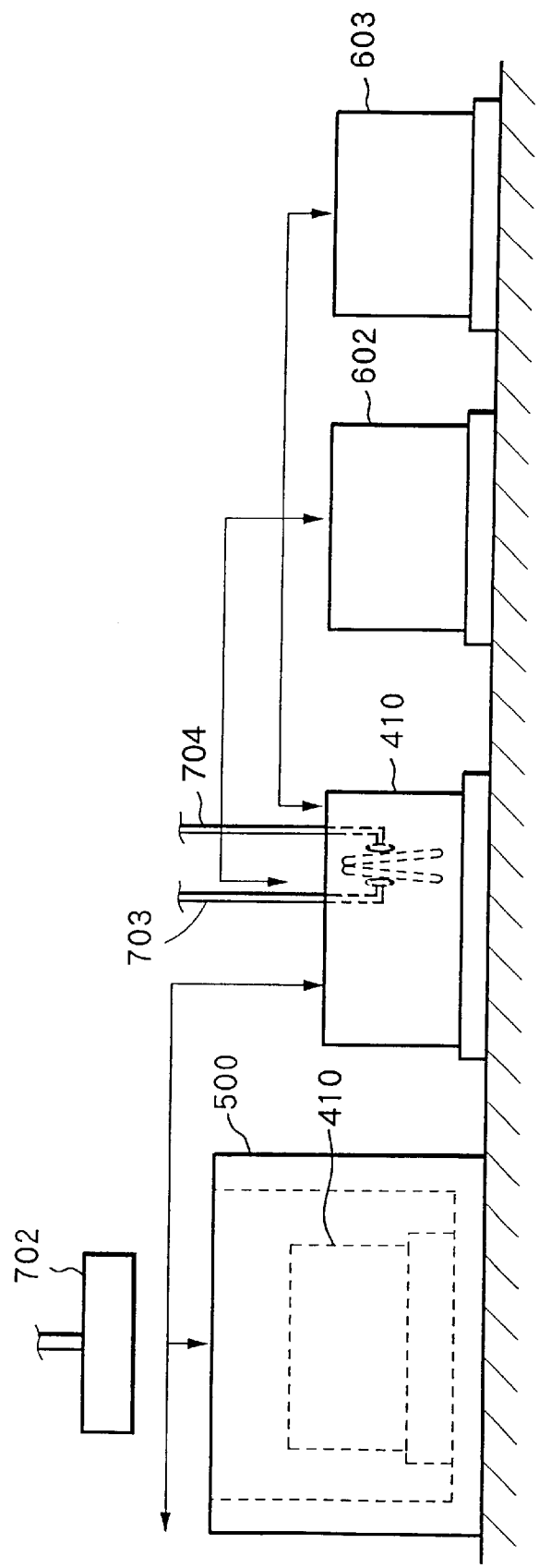
FIG. 30 is a view schematically showing the arrangement of the processing system according to the fourth embodiment of the second mode, which executes a series of processes of separating a bonded substrate stack into two substrates.

FIGS. 29 and 30 are views schematically showing the arrangement of a processing system for executing a series of processes of separating the bonded substrate stack 101 into two substrates at the porous layer 101b. FIG. 31 is a flow chart showing the control procedure of the processing system shown in FIGS. 29 and 30. Processing shown in this flow chart is controlled by a controller 700.

This processing system comprises the first separating apparatus 100 shown in FIG. 2, second separating apparatus 400 shown in FIG. 26, dry furnace (e.g., IPA vapor drier unit) 500, controller 700, robots 701, 703, and 704 for conveying a substrate, and a robot 702 for conveying the cassette 410.

Before processing by this processing system, a cassette 601 which stores one or a plurality of bonded substrate stacks 101 (e.g., substrate shown in FIG. 1C or 20C) and cassettes 602 and 603 for storing separated substrates are set at predetermined positions.

In this state, under the control of the controller 700, the robot 701 extracts one bonded substrate stack 101 from the cassette 601 and sets the bonded substrate stack in the separating apparatus 100 (S1401). Next, under the control of the controller 700, the separating apparatus 100 separates the first region (in this case, peripheral portion) of the bonded substrate stack 101 using a jet (S1402). Under the control of the controller 700, the robot 701 receives the bonded substrate stack 101 from the separating apparatus 100 and stores the bonded substrate stack 101 in the cassette 410 such that the groove in the side surface of the bonded substrate stack 101 engages with the distal end of a partition 411 in the cassette 410 (S1403).

The controller 700 determines whether a predetermined number of bonded substrate stacks 101 have been processed by the separating apparatus 100 and stored in the cassette 410 (S1404) If NO in step S1404, processing in steps S1401 to S1403 is repeated.

If YES in step S1404, under the control of the controller 700, the robot 702 dips the cassette 410 that stores the predetermined number of bonded substrate stacks 101 in the ultrasonic tank of the second separating apparatus 400 (S1405).

Next, under the control of the controller 700, the second separating apparatus 400 separates the second region (in this case, central portion) of each bonded substrate stack 101 using an ultrasonic wave (S1406). With this processing, each bonded substrate stack 101 is completely separated.

Under the control of the controller 700, the robot 702 extracts the cassette 410 from the ultrasonic tank of the second separating apparatus 400 and places the cassette 410 in the dry furnace 500 (S1407). Next, under the control of the controller 700, the dry furnace 500 dries the substrates stored in the cassette (S1408).

Under the control of the controller 700, the robot 702 extracts the cassette 410 from the dry furnace 500 and conveys the cassette 410 to a predetermined position (S1409). Under the control of the controller 700, the robot 703 chucks the lower surface of one (e.g., 10' shown in FIG. 1D) of the separated substrates, extracts it from the cassette 410, and stores it in the cassette 602. The robot 704 chucks the lower surface of the other (e.g., (10"+20) shown in FIG. 1E) of the separated substrates, extracts it from the cassette 410, and stores it in the cassette 603 (S1410).

For one (e.g., 10' shown in FIG. 1D) of two substrates separated in the above manner, the porous layer on the surface is removed, and the substrate is used as a single-crystal Si substrate 11 for forming another first substrate (e.g., 10 shown in FIG. 1B) (FIGS. 1A to 1E). On the other hand, for the other (e.g., (10"+20) shown in FIG. 1D) of the separated substrates, the porous layer on the surface is selectively removed, and the substrate is used as an SOI substrate (FIGS. 1A to 1E).

According to the fourth embodiment, by separating the second region in a liquid using an ultrasonic wave, defects in separation can be prevented. In addition, according to the fourth embodiment, since the second regions of a plurality of bonded substrate stacks are separated at once, the entire processing time can be shortened, and the throughput can be improved. Furthermore, according to the fourth embodiment, since the second region is separated in the ultrasonic tank, dust generated by first region separation processing can be removed from the substrate surface.

According to the second mode of the present invention, for example, an apparatus and method suitable for preventing defects in separating a sample such as a substrate having a separation layer can be provided.

The present invention is not limited to the above embodiments and various changes and modifications can be made within the spirit and scope of the present invention. Therefore, to apprise the public of the scope of the present invention, the following claims are made.

What is claimed is:

1. A separating apparatus for separating a sample having a separation layer at the separation layer comprising:

first separation means for ejecting a fluid to the separation layer to mainly separate a first region of the separation layer; and second separation means for mainly separating a second region of the separation layer using a vibration energy, wherein the sample is separated at the separation layer by said first and second separation means.

2. The apparatus according to claim 1, wherein the sample comprises a plate member having a layer with a fragile structure as the separation layer.

3. The apparatus according to claim 1, wherein the first region is a region at a periphery of the separation layer, and the second region is a region at a center of the separation layer.

4. The apparatus according to claim 1, wherein said first separation means ejects the fluid to the separation layer while rotating the sample about an axis perpendicular to the separation layer so as to mainly separate the first region.

5. The apparatus according to claim 1, wherein said apparatus, further comprises support means for supporting the sample in separation processing by said first and second separation means, and said second separation means supplies the vibration energy from a portion where said support means is in contact with the sample to the sample.

6. The apparatus according to claim 5, wherein said support means has a pair of opposing support surfaces for sandwiching a portion near a central portion of the sample from both sides and pressing the portion to support the sample, the support surface having a substantially circular shape.

7. The apparatus according to claim 6, wherein the first region is substantially positioned outside a region pressed by the support surfaces, and the second region is substantially the region pressed by the support surfaces.

8. The apparatus according to claim 1, wherein said second separation means comprises
   a process tank for processing the sample, and
   a vibration source for generating the vibration energy, and
   the vibration energy generated by said vibration source is supplied to the sample via a liquid in said process tank while immersing the sample processed by said first separation means in said process tank.

9. The apparatus according to claim 8, wherein said process tank comprises partition means for partitioning separated samples when the sample is completely separated by the vibration energy.

10. The apparatus according to claim 1, wherein said first separation means mainly separates the first region first, and then, said second separation means mainly separates the second region.

11. The apparatus according to claim 1, wherein said second separation means mainly separates the second region first, and then, said first separation means mainly separates the first region.

12. The apparatus according to claim 1, wherein separation processing by said first separation means and at least part of separation processing by said second separation means are parallelly executed.

13. The apparatus according to claim 1, wherein the sample is formed by bonding a first plate member having a fragile layer to a second plate member.

14. The apparatus according to claim 13, wherein the fragile layer comprises a porous layer.

15. The apparatus according to claim 13, wherein the first plate member comprises a semiconductor substrate.

16. The apparatus according to claim 15, wherein the first plate member is formed by forming the porous layer on one surface of a semiconductor substrate and forming a non-porous layer on the porous layer.

17. The apparatus according to claim 16, wherein the non-porous layer includes a single-crystal semiconductor layer.

18. A separating apparatus for separating a sample having a separation layer at the separation layer comprising:
   a support portion for su porting the sample;
   an ejection portion for ejecting a fluid to the separation layer of the sample supported by said support portion;
   a vibration source for generating a vibration energy to be supplied to the sample; and
   a control section for causing said ejection portion to eject the fluid to mainly separate a first region of the separation layer by the fluid and causing said vibration source to generate the vibration energy to mainly separate a second region of the separation layer by the vibration energy.

19. The apparatus according to claim 18, wherein the sample comprises a plate member having a layer with a fragile structure as the separation layer.

20. The apparatus according to claim 18, wherein said support portion supports the sample while rotating the sample about an axis perpendicular to the separation layer.

21. The apparatus according to claim 18, wherein said control section controls said ejection portion a d said vibration source to mainly separate the first region first by the fluid and then mainly separate the second region by the vibration energy.

22. The apparatus according to claim 18, wherein said control section controls said ejection portion and said vibration source to mainly separate the second region first by the vibration energy and then mainly separate the first region by the fluid.

23. The apparatus according to claim 18, wherein said control section controls said ejection portion and said vibration source to parallelly execute separation processing of the sample by the fluid and at least part of separation processing of the sample by the vibration energy.

24. The apparatus according to claim 18, wherein the first region is a region at a periphery of the separation layer, and the second region is a region at a center of the separation layer.

25. The apparatus according to claim 18, wherein said support portion has a pair of opposing support surfaces for sandwiching a portion near a central portion of the sample from both sides and pressing the portion to support the sample, the support surface having a substantially circular shape.

26. The apparatus according to claim 25, wherein the first region is positioned substantially on an outer peripheral side of a region pressed by the support surfaces, and the second region is substantially the region pressed by the support surfaces.

27. The apparatus according to claim 18, wherein said vibration source is arranged at said support portion.

28. The apparatus according to claim 18, wherein said vibration source is arranged at a distal end of said support portion, where said support portion comes into contact with the sample.

29. The apparatus according to claim 18, wherein said apparatus, further comprises a process tank for processing the sample, to separate the sample using the fluid, the fluid is ejected to the separation layer of the sample while supporting the sample by said support portion, and to separate the sample using the vibration energy, the vibration energy generated by said vibration source is supplied to the sample via a liquid in said process tank while immersing the sample in said process tank.

30. The apparatus according to claim 29, further comprising a dry furnace for drying the sample processed in said process tank.

31. The apparatus according to claim 30, further comprising a conveyor mechanism for conveying the sample between said support portion, said process tank and said dry furnace.

32. The apparatus according to claim 29, further comprising a conveyor mechanism for receiving the sample from said support portion and conveying the sample to said process tank.

33. The apparatus according to claim 30, further comprising a conveyor mechanism for sequentially receiving a plurality of samples from said support portion, sequentially storing the plurality of samples in one cassette, immersing the cassette in said process tank, and after processing in said process tank is ended, receiving the cassette from said process tank and conveying the cassette to said dry furnace.

34. The apparatus according to claim 33, further comprising a classification mechanism for, after separated samples are dried in said dry furnace, extracting the separated samples from said dry furnace and classifying the samples.

35. The apparatus according to claim 29, further comprising a conveyor mechanism for sequentially receiving a plurality of samples from said support portion, sequentially storing the plurality of samples in one cassette, and setting the cassette in said process tank.

36. The apparatus according to claim 18, further comprising a classification mechanism for classifying separated samples.

37. The apparatus according to claim 18, wherein the sample is formed by bonding a first plate member having a fragile layer to a second plate member.

38. The apparatus according to claim 37, wherein the fragile layer comprises a porous layer.

39. The apparatus according to claim 37, wherein the first plate member comprises a semiconductor substrate.

40. The apparatus according to claim 39, wherein the first plate member is formed by forming the porous layer on one surface of a semiconductor substrate and forming a non-porous layer on the porous layer.

41. The apparatus according to claim 40, wherein the non-porous layer includes a single-crystal semiconductor layer.

42. A separating apparatus for separating a sample having a separation layer at the separation layer comprising:

a support portion for su porting the sample;

an ejection portion for ejecting a fluid to the separation layer of the sample supported by said support portion;

a vibration source for generating a vibration energy to be supplied to the sample; and a process tank for processing the sample, wherein the sample is separated by-the fluid and vibration energy, wherein to separate the ample using the fluid, the fluid is ejected to the separation layer of the sample while supporting the sample by said support portion, wherein to separate the sample using the vibration energy, the vibration energy generated by said vibration source is supplied to the sample via a liquid in said process tank while immersing the sample in said process tank, and wherein said process tank has a partition member for partitioning separated samples when the sample is completely separated by the vibration energy.

* * * * *

UNITED STATES PATENT AND TRADEMARK OFFICE
CERTIFICATE OF CORRECTION

PATENT NO. : 6,609,553 B2 Page 1 of 1
DATED : August 26, 2003
INVENTOR(S) : Kazutaka Yanagita et al.

It is certified that error appears in the above-identified patent and that said Letters Patent is hereby corrected as shown below:

<u>Column 36,</u>
Line 41, "for su porting" should read -- for supporting --
Line 59, "a d said" should read -- and said --

<u>Column 38,</u>
Line 36, "for su porting" should read -- for supporting --
Line 45, "the ample" should read -- the sample --

Signed and Sealed this

Twentieth Day of January, 2004

JON W. DUDAS
*Acting Director of the United States Patent and Trademark Office*